(12) United States Patent
Li et al.

(10) Patent No.: US 10,568,172 B2
(45) Date of Patent: Feb. 18, 2020

(54) DIMMABLE SOLID-STATE LIGHT EMITTING DEVICES

(71) Applicant: Intematix Corporation, Fremont, CA (US)

(72) Inventors: Yi-Qun Li, Danville, CA (US); Xiongfei Shen, Fremont, CA (US); Gang Wang, Sunnyvale, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 16/221,860

(22) Filed: Dec. 17, 2018

(65) Prior Publication Data

US 2019/0191516 A1 Jun. 20, 2019

Related U.S. Application Data

(60) Provisional application No. 62/599,739, filed on Dec. 17, 2017.

(51) Int. Cl.
*H05B 33/00* (2006.01)
*H05B 33/08* (2020.01)
(Continued)

(52) U.S. Cl.
CPC ......... *H05B 33/0845* (2013.01); *F21K 9/232* (2016.08); *H01L 25/13* (2013.01); *H01L 33/504* (2013.01); *F21Y 2115/10* (2016.08)

(58) Field of Classification Search
CPC .................. H01L 33/504; H01L 25/13; H01L 31/035281; H01L 31/055; H01L 31/165; H01L 31/167; H01L 33/502; H01L 2924/00; H01L 2224/45015; H01L 2924/00014; H01L 2224/48091; H01L 2924/12041; H01L 2924/181; H01L 2224/32245; H01L 2224/73265;
(Continued)

(56) References Cited

U.S. PATENT DOCUMENTS 8,529,791 B2 9/2013 Wu et al.
8,597,545 B1 12/2013 Liu et al.
(Continued)

FOREIGN PATENT DOCUMENTS

WO 2017044380 A1 3/2017
WO 2017062314 A1 4/2017

OTHER PUBLICATIONS

International Search Report.
Written Opinion of the ISA.

*Primary Examiner* — Monica C King

(57) ABSTRACT

A white light emitting device or LED-filament comprises: a solid-state light emitter (LED) operable to generate excitation light; a first phosphor associated with the solid-state light emitter to generate light with a peak emission wavelength in a range 500 nm to 575 nm; and a second phosphor associated with the solid-state light emitter to generate light with a peak emission wavelength in a range 600 nm to 650 nm, wherein a percentage decrease in conversion efficiency corresponding to an increase in excitation light photon density exhibited by the second phosphor is larger than a percentage decrease in conversion efficiency corresponding to the same increase in excitation light photon density exhibited by the first phosphor.

20 Claims, 26 Drawing Sheets

SECTION A-A

SECTION B-B

(51) Int. Cl.
*F21K 9/232* (2016.01)
*H01L 25/13* (2006.01)
*H01L 33/50* (2010.01)
*F21Y 115/10* (2016.01)

(58) Field of Classification Search
CPC . H01L 2224/48247; H01L 2924/12042; H01L 2924/00012; H01L 2924/20752; H01L 2924/20753; H01L 2224/45124; H01L 2224/48257; H01L 2924/12036; H01L 2924/12044; H01L 2924/30107; H01L 2224/45144; H01L 24/45; H01L 2224/45099; H01L 2224/32257; H01L 2224/48137; H01L 2224/48227; H01L 24/48; H01L 25/0753; H01L 2924/15313; H01L 33/486; H01L 33/505; H01L 33/508; H01L 33/54; H01L 33/60; H01L 27/14; H01L 27/1446; H01L 27/1462; H01L 27/14643; H01L 27/156; H01L 31/02161; H01L 31/02168; H01L 31/022408; H01L 31/02322; H01L 31/028; H01L 31/035227; H01L 31/105; H01L 31/1055; H01L 31/107; H01L 31/145; H01L 33/06; H05B 33/0845; H05B 33/14; H05B 37/0218
See application file for complete search history.

(56) References Cited

U.S. PATENT DOCUMENTS

| | | |
|---|---|---|
| 8,663,502 B2 | 3/2014 | Tao |
| 15,282,551 | 5/2017 | Zhu et al. |
| 2011/0215700 A1* | 9/2011 | Tong .................. F21V 3/02 313/46 |
| 2011/0227469 A1* | 9/2011 | Yuan .................. F21V 3/02 313/46 |
| 2016/0116124 A1 | 4/2016 | Podowitz et al. |
| 2017/0145310 A1 | 5/2017 | Li et al. |

* cited by examiner

SECTION A-A

SECTION B-B

SECTION C-C

SECTION D-D

DIMMABLE SOLID-STATE LIGHT EMITTING DEVICES

FIELD OF THE INVENTION

Embodiments of the invention relate to dimmable solid-state light emitting devices, typically LED-based, and more particularly LED-filaments and white LEDs for use in lamps and lighting arrangements. The invention concerns LED-filaments and white LEDs whose color temperature of light decreases as power to the LED-filament/white LED is decreased (dimmed).

This application claims priority to U.S. Provisional Patent Application Ser. No. 62/599,739, filed Dec. 17, 2017, which is hereby incorporated by reference in its entirety.

BACKGROUND OF THE INVENTION

White light emitting LEDs ("white LEDs") include one or more photoluminescence materials (e.g., phosphor materials), which absorb a portion of excitation radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor combined with the light emitted by the phosphor provides light which appears to the human eye as being nearly white in color. Due to their long operating life expectancy (>50,000 hours) and high luminous efficacy (100 lm/W and higher) white LEDs are rapidly being used to replace conventional fluorescent, compact fluorescent and incandescent lamps.

Recently, LED-filament lamps have been developed comprising LED-filaments whose visual appearance closely resemble the filament of a traditional incandescent lamp. The LED-filaments, which are typically about two inches (50 mm) long, comprise COG (Chip-On-Glass) devices having a plurality of low-power LED chips mounted on a light-transmissive glass substrate. The LED-filaments are encased in a phosphor-impregnated encapsulant, such as silicone.

One perceived shortcoming or characteristic of white LEDs, LED-filaments and fluorescent lamps, compared with traditional incandescent bulbs, is that as they are dimmed the color temperature (CCT) of their light emission does not change; that is, it remains substantially constant. By contrast—for an incandescent lamp—the CCT can change from a warm white (2700 K) at full power to a warm orange glow (900 K) when fully dimmed; a range of 1800K. For many applications, such a characteristic would be highly desirable for LED-filaments and white LEDs. It is, therefore, an object of the present invention to provide a solid-state white light emitting device that at least in part addresses the limitations of known devices and whose color temperature of emitted light decreases on dimming, thus resembling, at least in part, a conventional incandescent light bulb.

SUMMARY OF THE INVENTION

Embodiments of the invention concern solid-state light emitting devices (white LEDs) and lamps and LED-filaments and LED-filament lamps.

Embodiments of the invention relate to white light emitting devices and LED-filaments having a red-emitting photoluminescence material (eg. Phosphor) and a yellow to green-emitting photoluminescence material (eg. Phosphor) that are excitable by excitation light (typically blue excitation light) and in which "blue quenching" occurs in the red-emitting photoluminescence material to a greater extent than the yellow to green-emitting photoluminescence material. For the sake of brevity, in the following disclosure "photoluminescence materials" are referred to as "phosphors", although it will be appreciated that other types of photoluminescence materials may be also be suitable, such as quantum dots. More particularly, the red phosphor exhibits a percentage decrease in conversion efficiency with increasing DC power to an associated LED—more specifically, an increase in excitation (blue) photon density—that is substantially larger than the percentage decrease in conversion efficiency of the yellow to green-emitting phosphor with increasing power. Such an arrangement has the effect that the relative proportion of green and red light in the emission spectrum of the device/LED-filament will change with power and it is this change in the emission spectrum which results in a change in color temperature of emitted light in response to the change in power. Thus, through the use of a combination of red-emitting and yellow to green-emitting phosphors having different "blue quenching" properties, this enables the provision of white light emitting devices and LED-filaments that exhibit "warm dimming" since the color composition of light (color temperature) generated by the device with vary with power. In this specification, "warm dimming" is defined as a reduction (decrease) in color temperature on dimming (reduction in power), that is the proportion of red light increases in response to a decrease in power level.

"Blue quenching" is defined as the decrease of conversion efficiency (CE) and/or chromaticity (color) change with an increase in excitation (blue) photon density. The excitation (blue) photon density can be increased by increasing the DC power provided to an LED that generates excitation (blue) photons. While it is postulated that the decrease (reduction) of the conversion efficiency (CE) with increasing excitation energy (blue photon density) is primarily responsible for the "warm dimming" effect, the greater change of chromaticity CIE x ($\Delta$CIE x) and CIE y ($\Delta$CIE y) of light generated by the red phosphor with increasing excitation (blue) photon density compared with light generated by the yellow to green-emitting phosphor may also contribute to the "warm dimming" effect. Additionally, the red-emitting phosphor of the invention may exhibit a photoluminescence characteristic with an enhanced level of "thermal quenching", compared with the yellow to green-emitting phosphors, and this may further increase the amount of "warm dimming". "Thermal quenching" is defined as the decrease of emission intensity and/or chromaticity (color) change with an increase in temperature.

In accordance with an embodiment of the invention, there is provided a white light emitting device or LED-filament comprising: a solid-state light emitter operable to generate excitation light; a first phosphor associated with the solid-state light emitter to generate light with a peak emission wavelength in a range 500 nm to 575 nm; and a second phosphor associated with the solid-state light emitter to generate light with a peak emission wavelength in a range 600 nm to 650 nm, wherein a percentage decrease in conversion efficiency corresponding to an increase in excitation light photon density exhibited by the second phosphor is larger than a percentage decrease in conversion efficiency corresponding to the same increase in excitation light photon density exhibited by the first phosphor. This may also be expressed as the decrease (reduction) in conversion efficiency with increasing excitation light photon density exhibited by the second phosphor is larger than that of the first phosphor.

In accordance with an embodiment of the invention, a white light emitting device or LED-filament comprises: a solid-state light emitter to generate excitation light; a first phosphor operable to generate light with a peak emission wavelength in a range 500 nm to 575 nm (that is light in the yellow to green part of the visible spectrum); and a second phosphor operable to generate light with a peak emission wavelength in a range 600 nm to 650 nm (that is light in the red part of the visible spectrum), wherein a decrease in conversion efficiency with increasing excitation light photon density exhibited by the second phosphor is larger than that of the first. The excitation light may comprise blue light with a dominant wavelength in a range 440 nm to 470 nm or shorter wavelength violet or UV light. In some embodiments, the percentage conversion efficiency of the second phosphor decreases by at least 8% in response to a 95% increase in excitation light photon density. In contrast, the percentage conversion efficiency of the first phosphor decreases by at least 2% in response to a 95% increase in excitation light photon density.

It may be that the white light emitting device or LED-filament may comprise a light transmissive substrate for at least mounting said solid-state light emitter thereon.

In embodiments, it may be that a percentage decrease in peak emission intensity corresponding to an increase in temperature exhibited by the second phosphor is larger than a percentage decrease in peak emission intensity corresponding to the same increase in temperature exhibited by the first phosphor.

The second (red-emitting) phosphor can further comprise a photoluminescence characteristic having a peak emission intensity that decreases with increasing temperature. In some embodiments, it may be that the percentage decrease in peak emission intensity of the second phosphor decreases by at least 18% in response to an increase in temperature from 25° C. to 200° C.

According to an embodiment, the second (red-emitting) phosphor may comprise a Group IIA/IM selenide sulfide-based phosphor material. The Group IIA/IM selenide sulfide-based phosphor material can comprise a composition $MSe_{1-x}S_x:Eu_y$, wherein M is at least one of Mg, Ca, Sr, Ba and Zn, $0<x<1.0$ and $0.0005 \leq y<0.005$. In some embodiments, M may comprise calcium.

The white light emitting device or LED-filament can be configured such that in operation a reduction (decrease) in DC power to the solid-state light emitter of about 90% of full DC power results in a reduction (decrease) in CCT of emitted light of at least 400K and or of at least 700K or of at least 1500K.

According to another aspect of the invention, there is envisaged a white light emitting device or LED-filament comprising: a solid-state light emitter to generate excitation light with a dominant wavelength in a range 440 nm to 470 nm; a first phosphor associated with the solid-state light emitter to generate light with a peak emission wavelength in a range 500 nm to 575 nm; and a second phosphor associated with the solid-state light emitter to generate light with a peak emission wavelength in a range 600 nm to 650 nm, wherein the second phosphor comprises a Group IIA/IIB selenide sulfide-based phosphor material and wherein the white light emitting device is configured such that in operation a reduction in DC power to the solid-state light emitter of about 90% results in a reduction in CCT of emitted light of at least 700K. Defined, there may be a blue-light excitable yellow to green-emitting phosphor operable to generate light with a peak emission wavelength in a range 500 nm to 575 nm; and a blue-light excitable red-emitting phosphor operable to generate light with a peak emission wavelength in a range 600 nm to 650 nm.

According to further aspect, the invention encompasses a method of dimming a white light emitting device or LED-filament comprising the steps of: providing a solid-state light emitter to generate excitation light with a dominant wavelength in a range 440 nm to 470 nm; providing a first phosphor associated with the solid-state light emitter to generate light with a peak emission wavelength in a range 500 nm to 575 nm; providing a second phosphor associated with the solid-state light emitter to generate light with a peak emission wavelength in a range 600 nm to 650 nm; wherein a percentage decrease in conversion efficiency corresponding to an increase in excitation light photon density exhibited by the second phosphor is larger than a percentage decrease in conversion efficiency corresponding to the same increase in excitation light photon density exhibited by the first phosphor; and decreasing the DC power to the solid-state light emitter to decrease the excitation light photon density.

The method may comprise the step of decreasing the DC power to the solid-state light emitter of about 90% results in decreasing the CCT of emitted light by at least 400K or by at least 700K or by at least 1500K.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, in which.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Embodiments of the invention are directed to solid-state light emitting devices comprising solid-state light emitters, typically LEDs, that are operable to generate excitation light (typically blue light) which is used to excite a photoluminescence material, such as a blue light excitable phosphor material. In particular, embodiments of the invention concern solid-state light emitting devices that at least in part overcome the limitations of the known devices and whose color temperature of emitted light decreases on dimming. In this specification, the characteristic of a light emitting device whose color temperature decreases (i.e. moves towards a warmer color temperature) as it is dimmed will be referred to as "warm dimming".

LED-Filament Lamp: A-Series (A19) Lamp

Figure 1A:
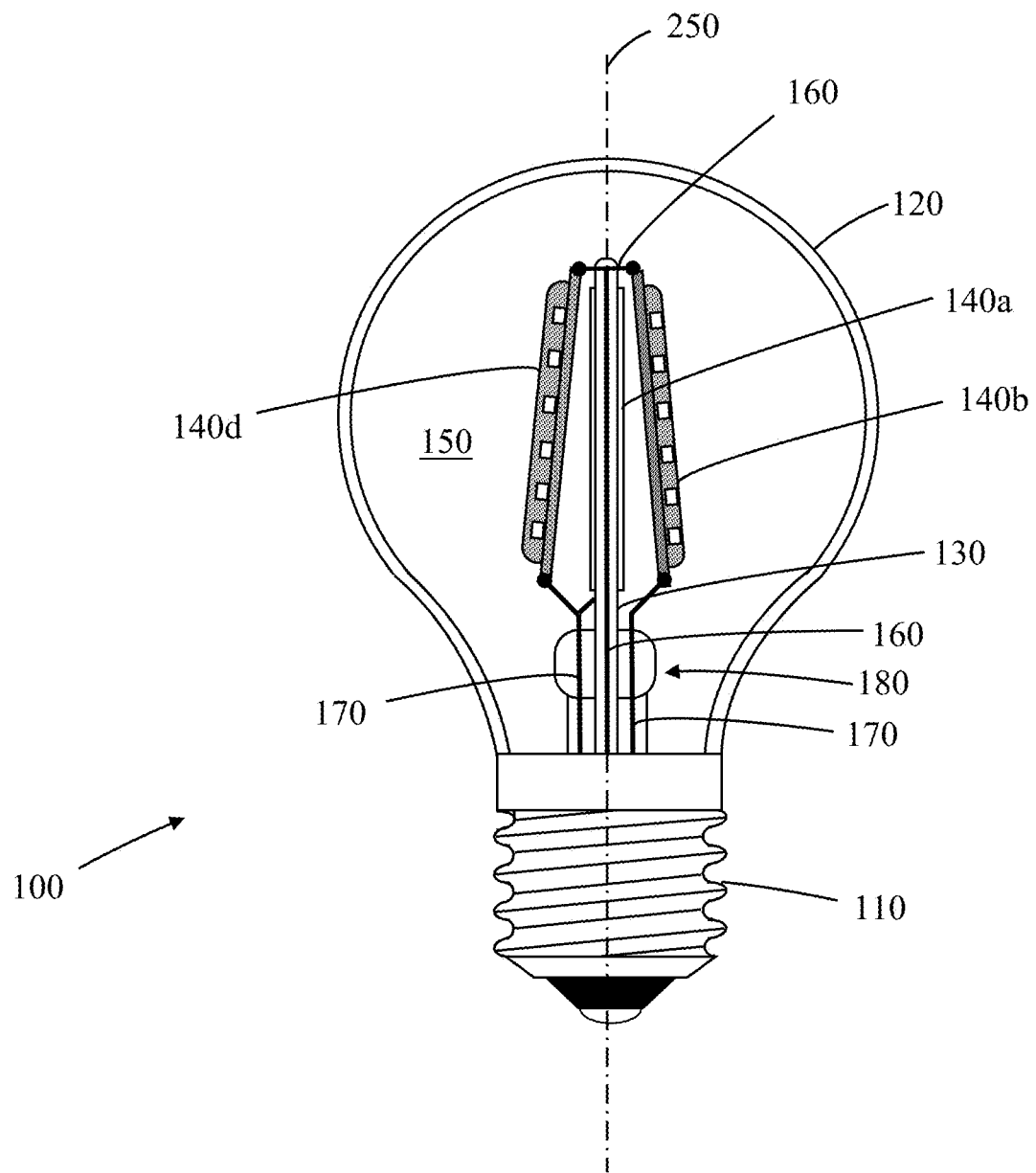
FIGS. 1A and 1B respectively illustrate partial cross-sectional A-A side and plan views of a four LED-filament A-Series (A19) lamp in accordance with an embodiment of the invention.
Figure 1B:
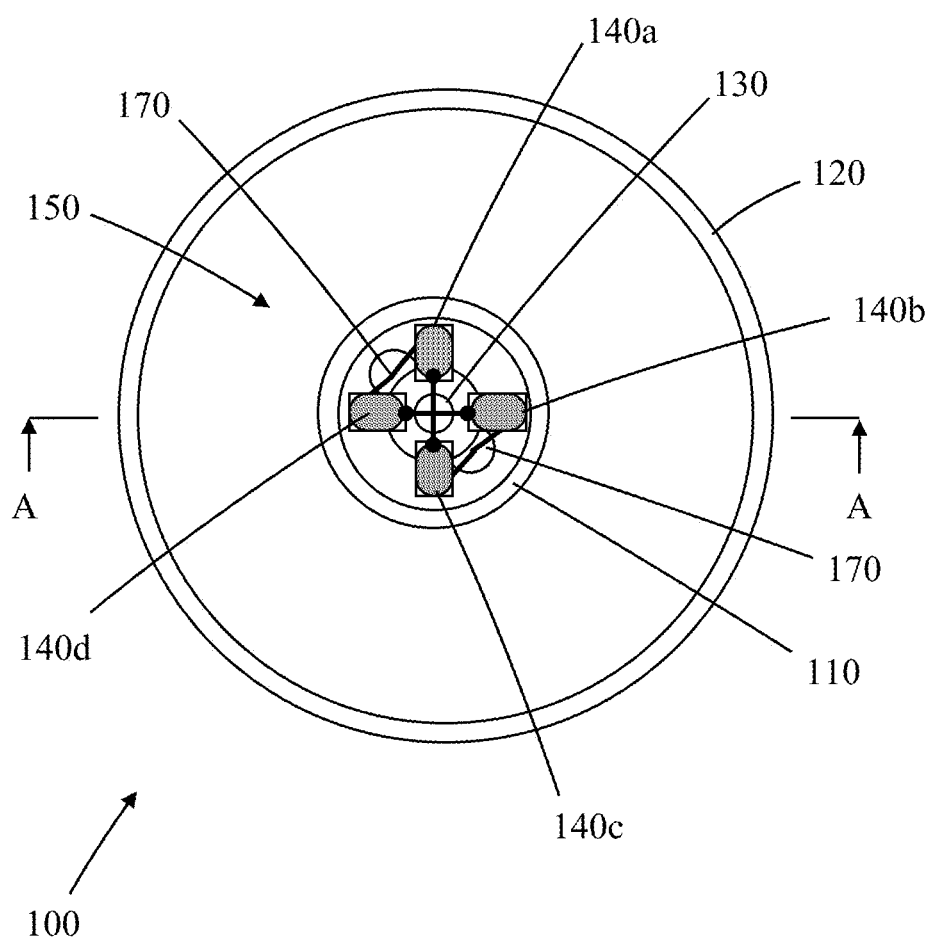

FIGS. 1A and 1B respectively illustrate a partial cross-sectional side view through A-A and a partial cutaway plan view of an LED-filament A-Series lamp (bulb) 100 in accordance with an embodiment of the invention. The LED-filament lamp (bulb) 100 is intended to be an energy efficient replacement for an incandescent A19 light bulb and can be configured at full power (i.e. undimmed) to generate 550 lm of light with a CCT (Correlated Color Temperature) of 2700 K and a CRI Ra of 80 and is configured such that its CCT decreases as power to the device is reduced, i.e. as the device is dimmed. The LED-filament lamp is nominally rated at 4 W. As is known, an A-series lamp is the most common lamp type and an A19 lamp is 2⅜ inches (19/8) wide at its widest point and approximately 4⅜ inches in length.

The LED-filament lamp 100 comprises a connector base 110, a light-transmissive envelope 120; an LED-filament support 130 and four LED-filaments 140a, 140b, 140c, 140d.

In some embodiments, the LED-filament lamp 100 can be configured for operation with a 110V (r.m.s.) AC (60 Hz) mains power supply as used in North America. For example, and as illustrated, the LED-filament lamp 100 can comprise an E26 (φ26 mm) connector base (Edison screw lamp base) 110 enabling the lamp to be directly connected to a mains power supply using a standard electrical lighting screw socket. It will be appreciated that depending on the intended application other connector bases can be used such as, for example, a double contact bayonet connector (i.e. B22d or BC) as is commonly used in the United Kingdom, Ireland, Australia, New Zealand and various parts of the British Commonwealth or an E27 (φ27 mm) screw base (Edison screw lamp base) as used in Europe. The connector base 110 can house rectifier or other driver circuitry (not shown) for operating the LED-filament lamp.

The light-transmissive envelope 120 is attached to the connector 110. The light-transmissive envelope 120 and LED-filament support 130 can comprise glass such that the envelope defines a hermetically sealed volume 150 in which the LED-filaments 140*a* to 140*d* are located. The envelope 120 can additionally incorporate or include a layer of a light diffusive (scattering) material such as for example particles of Zinc Oxide (ZnO), titanium dioxide ($TiO_2$), barium sulfate ($BaSO_4$), magnesium oxide (MgO), silicon dioxide ($SiO_2$) or aluminum oxide ($Al_2O_3$).

The LED-filaments 140*a* to 140*d*, which are linear (strip or elongate) in form, are oriented such that their direction of elongation is generally parallel to an axis 250 of the lamp 100. The LED-filaments 140*a* to 140*b* can be equally circumferentially spaced around the glass filament support 130 (FIG. 1B). A first electrical contact (230*a*—FIG. 2A) on a first end of each LED-filament 140*a* to 140*d* distal to the connector base 110 is electrically and mechanically connected to a first conducting wire 160 that passes down an axis of the LED filament support 130 to the connector base 110. A second electrical contact (230*b*—FIG. 2A) on a second end of each LED-filament 140*a* to 140*d* proximal to the connector base 110 is electrically and mechanically connected to a second conducting wire 170 that passes through a base portion 180 of the LED filament support 130 to the connector base 110. As illustrated, the LED filaments 140*a* to 140*d* are electrically connected in parallel.

Figure 2A:
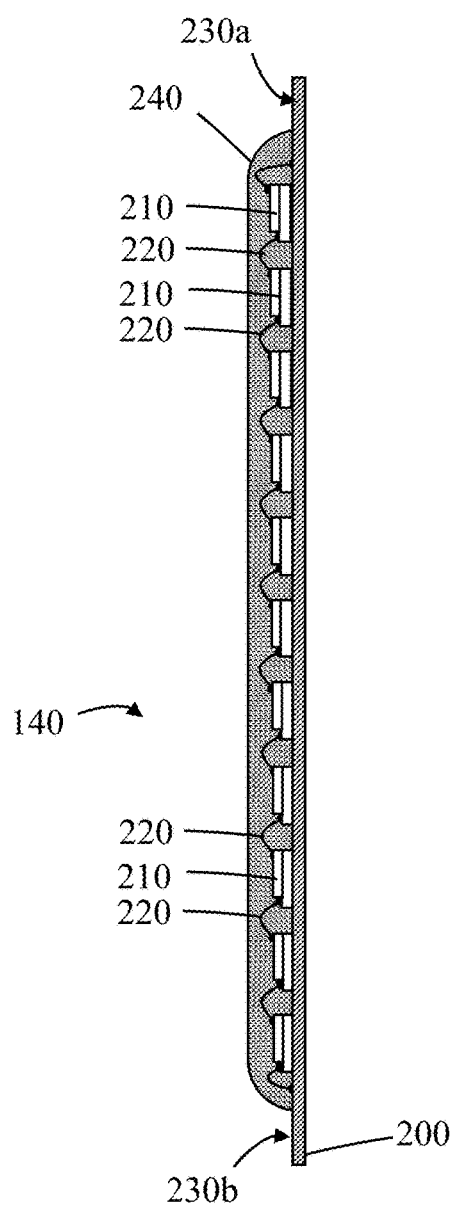
FIGS. 2A and 2B illustrates schematic cross-sectional B-B side and partial cutaway side views of an LED-filament in accordance with an embodiment of the invention for use in the lamp of FIGS. 1A and 1B.
Figure 2B:
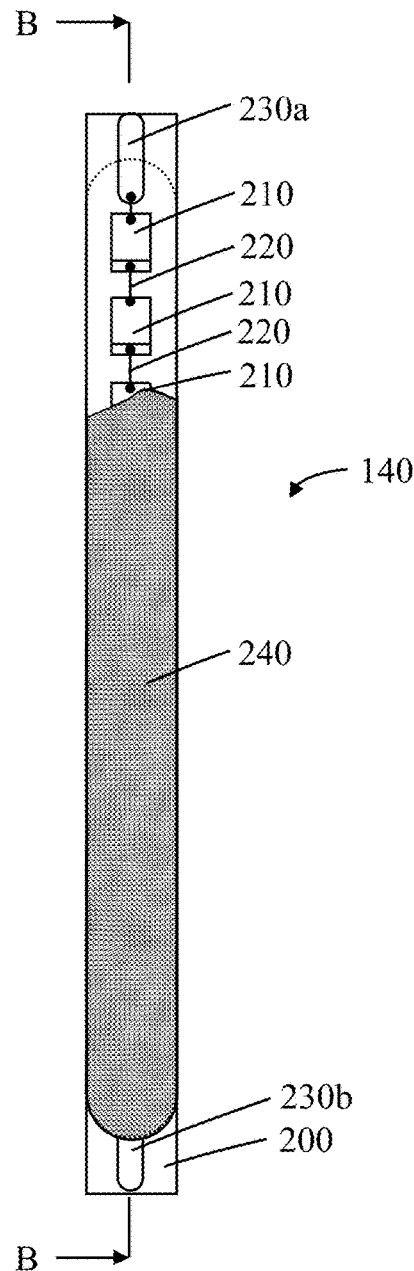

An LED-filament 140 according to an embodiment of the invention is now described with reference to FIGS. 2A and 2B which shows a cross-sectional side view through A-A and a partial cut-away plan of an LED-filament. The LED filament 140 comprises a light-transmissive substrate 200 having an array of blue emitting (440 to 470 nm) unpackaged LED chips (dies) 210 mounted directly to one face. Typically, each LED-filament has a total nominal power of about 1 W.

The substrate 200 can further comprise respective electrical contacts 230*a*, 230*b* at its first and second ends for electrical connection to a respective one of the conducting wires 160, 170 (FIG. 1A) to provide electrical power to operate the LED-filament. The electrical contacts 230*a*/230*b* can comprise copper, silver or other metal or a transparent electrical conductor such as indium tin oxide (ITO). In the embodiment illustrated, the substrate 200 is planar and has an elongate form (strip) with the LED chips 210 being configured as a linear array (string) along the length of the substrate. As indicated in FIGS. 2A and 2B, the LED chips 210 can be electrically connected in series by bond wires 220 between adjacent the LED chips of the string and wire bonds 220 between the LED chips at the distal ends of the substrate and the associated electrical contacts 230*a*/230*b*.

When the LED-filament 140 is used as a part of an energy efficient bulb, an elongate configuration may be preferred since the appearance and emission characteristics of the device more closely resembles a traditional filament of an incandescent bulb. Depending on the application, the substrate 200 can comprise other forms such as for example being square or circular and the LED chips configured as other arrays or configurations. It should be noted that the LED chips 210 are mounted directly to the substrate 200 and are not packaged. Such packaging would otherwise block the emission of light in a backward direction towards and through the substrate 200.

The substrate 200 can comprise any light-transmissive material which is at least translucent and preferably has a transmittance to visible light of 50% or greater. Accordingly, the substrate can comprise a glass or a plastics material such as polypropylene, silicone or an acrylic. To aid in the dissipation of heat generated by the LED chips 210, the substrate 200 is not only light-transmissive but is advantageously also thermally conductive to aid in the dissipation of heat generated by the LED chips. Examples of suitable light-transmissive thermally conductive materials include: magnesium oxide, sapphire, aluminum oxide, quartz glass, aluminum nitride and diamond. The transmittance of the thermally conductive substrate can be increased by making the substrate thin. To increase mechanical strength, the substrate can comprise a laminated structure with the thermally conductive layer mounted on a light-transmissive support such as a glass or plastics material. To further assist in the dissipation of heat, the volume within the glass envelope is preferably filled with a thermally conductive gas such as helium, hydrogen or a mixture thereof.

The LED-filament 140 further comprises a photoluminescence wavelength conversion material 240 comprising a mixture of a yellow to green-emitting photoluminescence material (eg. Phosphor) and a red-emitting photoluminescence material (eg. Phosphor) that is applied directly to the LEDs chips 210 in the form of an encapsulating layer.

The yellow to green-emitting photoluminescence material (eg. Phosphor) can comprise any photoluminescence material which, when excited by excitation light (typically blue excitation light), generates light with a peak emission wavelength $\lambda_p$ in a range 500 nm to 575 nm and can include for example silicate-based phosphors, a garnet-based phosphor such as YAG or LuAG phosphors. Examples of such phosphors are given in TABLE 1. In an embodiment, the yellow to green-emitting phosphor comprises a green-emitting LuAG-based phosphor as taught in U.S. Pat. No. 8,529,791 entitled "Green-Emitting, Garnet-Based Phosphors in General and Backlighting Applications" which is hereby incorporated in its entirety. Such a green-emitting phosphor comprises a cerium-activated, green-emitting lutetium aluminate phosphor consisting of lutetium, cerium, at least one alkaline earth metal, aluminum, oxygen, and at least one halogen, wherein the phosphor is configured to absorb excitation radiation having a wavelength ranging from about 380 nm to about 480 nm, and to emit light having a peak emission wavelength $\lambda_p$ ranging from about 500 nm to about 550 nm. An example of such a phosphor is GAL535 phosphor from Intematix Corporation, Fremont Calif., USA which has a peak emission wavelength of 535 nm.

TABLE 1

Example yellow to green-emitting phosphors

| Phosphor | General Composition | | Wavelength $\lambda_p$ (nm) |
|---|---|---|---|
| YAG | $Y_{3-x}(Al_{1-y}Ga_y)_5O_{12}:Ce_x$ | 0.01 < x < 0.2 & 0 < y < 2.5 | 520-550 |
| LuAG | $Lu_{3-x}(Al_{1-y}M_y)_5O_{12}:Ce_x$ | 0.01 < x < 0.2 & 0 < y < 1.5 M = Mg, Ca, Sr, Ba, Ga, | 500-575 |
| Silicate | $A_2SiO_4:Eu$ | A = Mg, Ca, Sr, Ba | 500-550 |
| Silicate | $(Sr_{1-x}Ba_x)_2SiO_4:Eu$ | 0.3 < x < 0.9 | 500-550 |

The red-emitting photoluminescence material (eg. Phosphor) can comprise any photoluminescence material which, when excited by excitation light (typically blue light), emits light with a peak emission wavelength $\lambda_p$ in a range 600 nm to 650 nm. As described below and in accordance with an embodiment of the invention, the red-emitting photoluminescence material exhibits a "blue quench" characteristic in which its emission intensity decreases as the excitation photon density increases.

Optionally, the photoluminescence wavelength conversion material can further comprise an orange to red-emitting photoluminescence material (eg. Phosphor) material, for example, for increasing CRI and/or reducing color temperature. The orange to red-emitting photoluminescence material can comprise any photoluminescence material which, when excited by blue light, emits light with a peak emission wavelength $\lambda_p$ in a range 580 nm to 620 nm and can include for example a silicate, europium activated silicon nitride-based phosphor or α-SiAlON phosphor. Examples of such orange to red-emitting phosphors are given in TABLE 2. In one embodiment, the orange-emitting phosphor comprises a red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/v$ and v is the valence of M. Alternatively, the red-emitting phosphor comprises a red light emitting nitride-based phosphor comprises a as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites. An example of one such a phosphor is XR600 red nitride phosphor from Intematix Corporation, Fremont Calif., USA which has a peak emission wavelength of 600 nm.

tion process is isotropic, phosphor light is generated equally in all directions and light emitted in a direction towards the substrate can pass through the substrate and be emitted from the rear of the LED-Filament. Use of a light-transmissive substrate thus enables the LED-filament to achieve a generally omnidirectional emission characteristic. Additionally, particles of a light reflective material can be combined with the phosphor material to reduce the quantity of phosphor required to generate a given emission product color. Furthermore, it should be understood that the color of the light generated by the LED-filament can be changed by including additional phosphors.

In other embodiments, the LED chip can comprise surface mountable or flip-chip devices. The LED chips 210 can be mounted to the substrate board by soldering, a thermally conductive adhesive or by other fixing methods which will be apparent to those skilled in the art.

Where the light-transmissive substrate 200 comprises a thermally conductive material, the LED chips 210 are advantageously mounted in thermal communication with the circuit board. A heat sink compound such as beryllium oxide can be used to aid in thermal coupling of the LED chips to the circuit board.

LED-Filament Lamps: B-Series (B11) Bullet Lamp

Figure 3A:
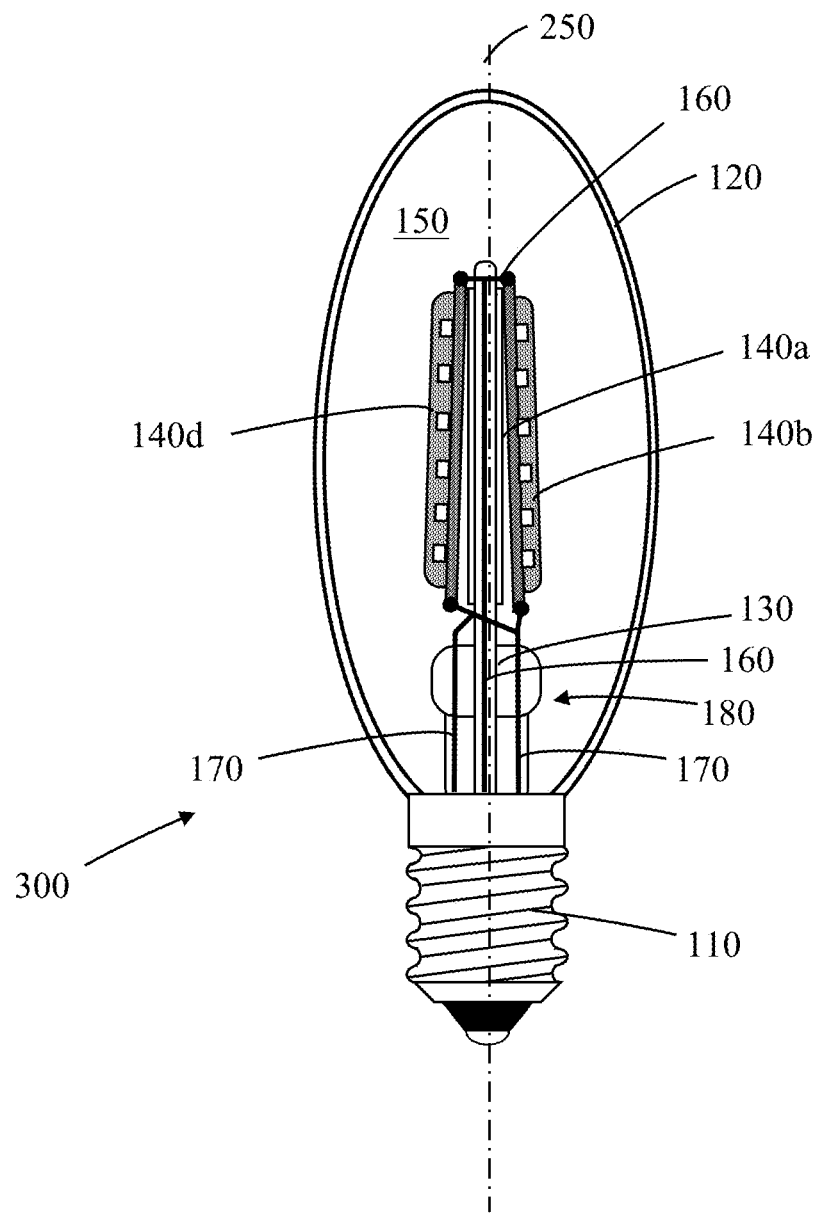
FIGS. 3A and 3B respectively illustrate partial cross-sectional C-C side and plan views of a four LED-filament B-Series (Bullet B11) lamp in accordance with an embodiment of the invention.
Figure 3B:
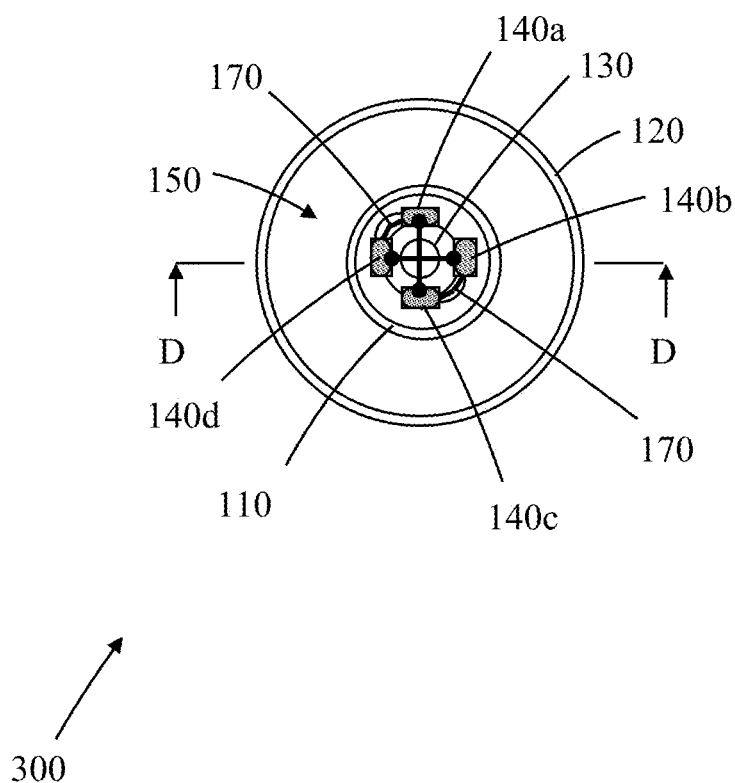

FIGS. 3A and 3B respectively illustrate a partial cross-sectional side view through C-C and a partial cutaway plan view of an LED-filament B-Series bullet lamp (candle bulb) 300 in accordance with an embodiment of the invention. The LED-filament lamp (bulb) 300 is intended to be an energy efficient replacement for an incandescent B11 bullet light bulb and is configured at full power (undimmed) to generate 450 lm of light with a CCT of 2700 K and a CRI Ra of 90 and is configured such that its CCT decreases as power to the device is reduced, i.e. as the device is dimmed. As is known, the B11 bullet lamp is 1⅜ inches (11/8) wide at its widest point. The LED-filament lamp 300 comprises four 1 W LED-filaments and is nominally rated at 4 W. The LED-filament lamp 300 is essentially the same as the A19 LED-filament lamp 100 described in relation to FIGS. 1A, 1B and like reference numerals are used to denote like parts.

As illustrated, the LED-filament lamp 300 can comprise an E12 (ϕ12 mm) connector base (Edison screw lamp base) 110. If practicable, the connector base 110 can house driver circuitry (not shown) for operating the LED-filaments. Where it is impracticable to house the driver circuitry in the connector base 110 the LED-filament lamp 300 can further

TABLE 2

Example orange to red-emitting phosphors

| Phosphor | General Composition | | Wavelength $\lambda_p$ (nm) |
|---|---|---|---|
| α-SiAlON | $Ca_{(x/2)}Si_{12-x}Al_xN_{16}$:Eu | $0 < x < 6$ | 580-610 |
| α-SiAlON | $M_xSi_{12-(m+n)}Al_{m+n}O_nN_{16-n}$:Eu | M = Ca, Sr, Y..; x<2 | 580-600 |
| CASN | $(Ca_{1-x}Sr_x)AlSiN_3$:Eu | $0.5 < x \leq 1$ | 600-660 |
| 258 nitride | $Ba_{2-x}Sr_xSi_5N_8$:Eu | $0 \leq x \leq 2$ | 580-620 |
| Silicate | $(Ba_xSr_{1-x})_3SiO_5$:Eu | $0 \leq x \leq 0.2$ | 586-600 |
| Silicate | $(Ba_xY_ySr_{1-x-y})_3(Al_ySi)O_5$:Eu | $0 \leq x \leq 0.2, 0 \leq y \leq 0.4$ | 600-615 |

In operation, blue excitation light generated by the LED chips 210 excites the photoluminescence wavelength conversion material 240 to generate yellow to green and red photoluminescence light. The emission product of the LED-filament 140 which appears white in color comprises the combined photoluminescence light and unconverted blue excitation light. Since the photoluminescence light generacomprise an extender (not shown) disposed between the envelope 120 and connector base 110. The extender can comprise for example a hollow frusto-conical element comprising a plastics material.

Light emitting devices of the present invention have been described herein as LED-filaments including a light-transmissive substrate which is elongate in form and also as devices with LED chips mounted on only one side of the substrate. However, in other embodiments the light-transmissive substrate may be circular, square, or one of many other shapes, the device may have LED chips may be mounted on both or several sides of a light-transmissive substrate.

LED-Based Light Emitting Devices—White LED

Figure 4A:
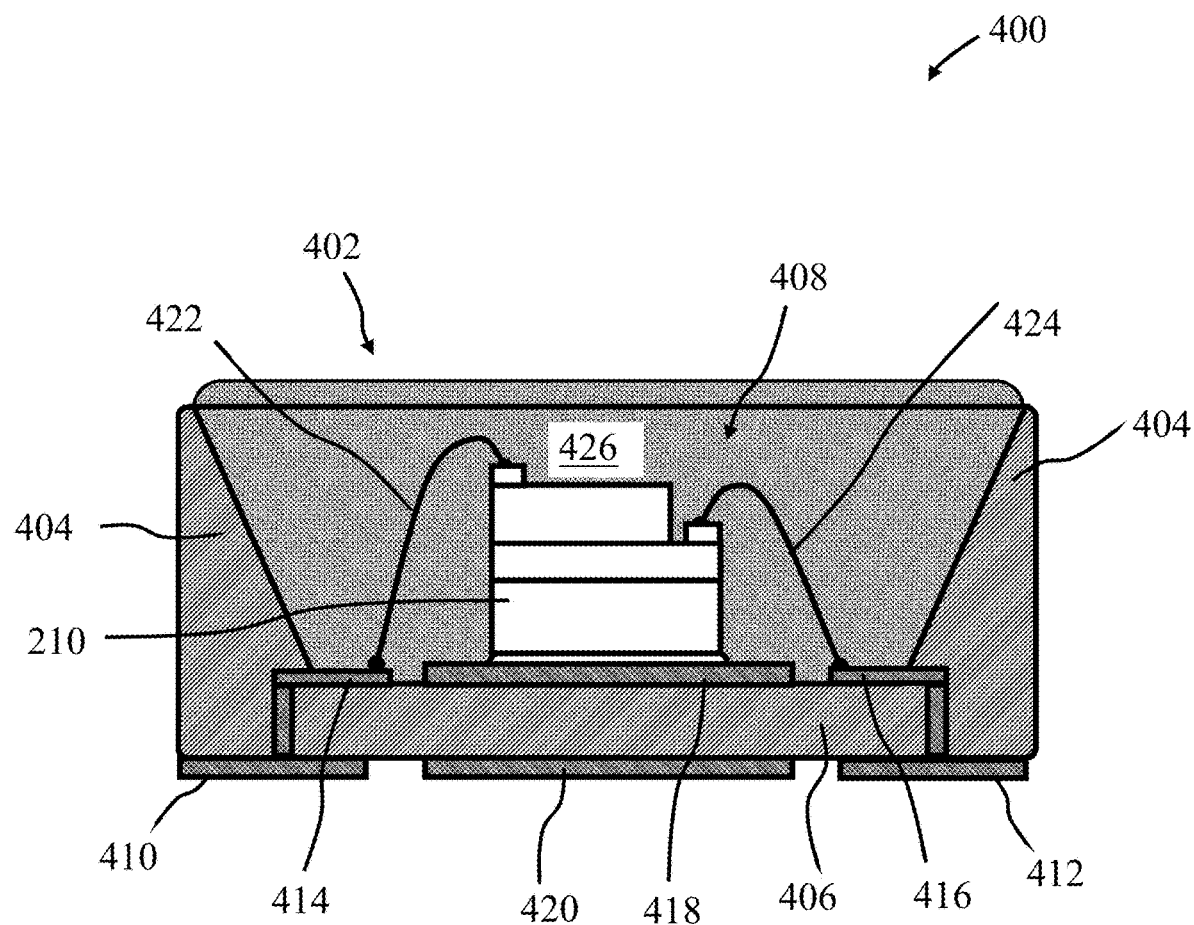
FIGS. 4A and 4B respectively illustrate a schematic cross-sectional D-D side and plan views of an LED-based light emitting device (white LED) in accordance with an embodiment of the invention.
Figure 4B:
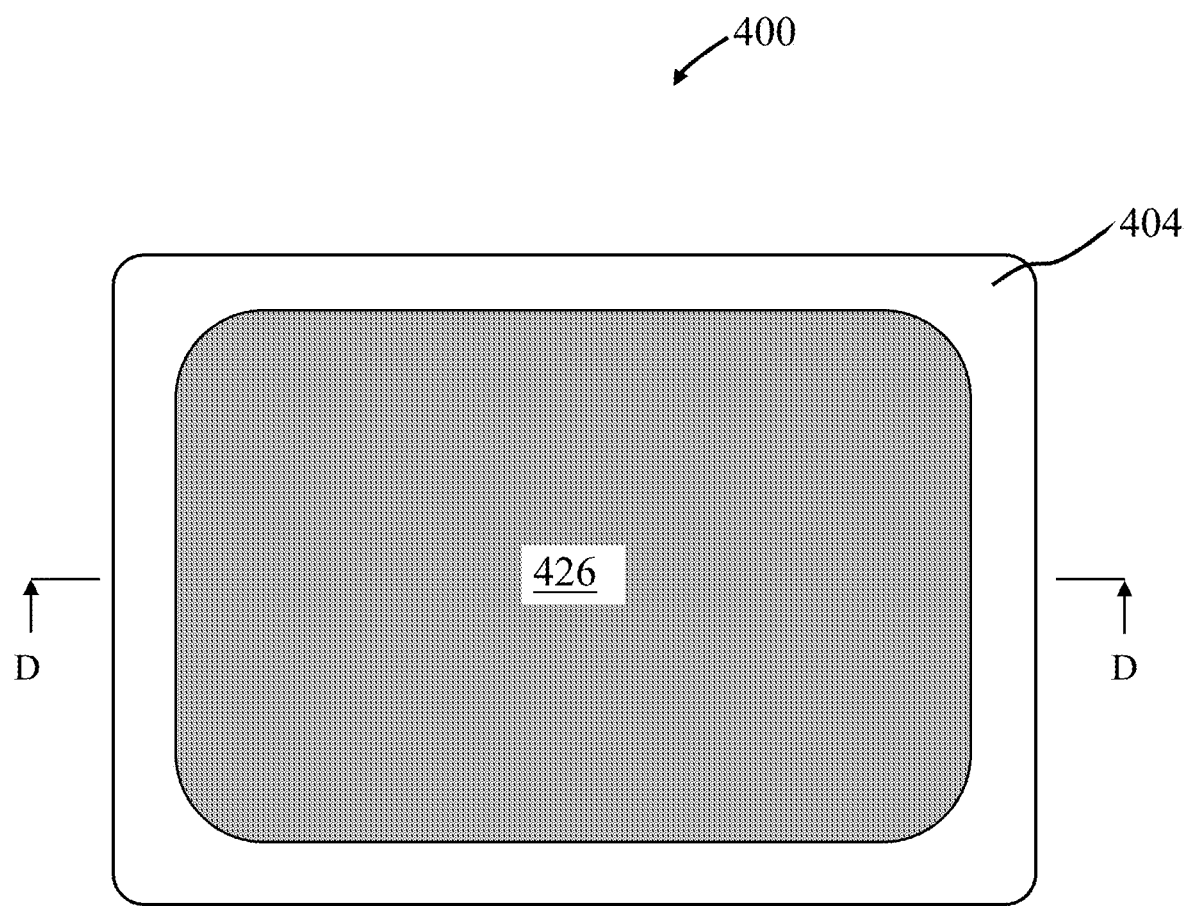

FIGS. 4A and 4B respectively show a schematic cross-sectional A-A representation and plan view of an LED-based light emitting device 400, white LED, in accordance with an embodiment of the invention. The device 10 is configured at full power (undimmed) to generate warm white light with a CCT (Correlated Color Temperature) of approximately 2700 K and is configured such that its color temperature decreases as power to the device is reduced, i.e. as the device is dimmed. Like reference numerals are used to denote like parts.

The device 400 can comprise one or more blue-emitting GaN (gallium nitride)-based LED chips 210 that are housed within a package 402. The one or more LED chips are operable to generate blue light with a dominant wavelength within a range of 440 nm to 470 nm, typically 450 nm to 455 nm. The package, which can for example comprise a Surface Mountable Device (SMD) such as an SMD 5630 LED package, comprises upper and lower body portions 404 and 406. The upper body portion 404 defines a rectangular-shaped recess (cavity) 408 which is configured to receive the one or more LED chips 210. The package further comprises electrical connectors 410 and 412 on the base that are electrically connected to corresponding electrode contact pads 414 and 416 on the floor of the recess 408. Using adhesive or solder, the LED chip(s) 110 can be mounted to a thermally conductive pad 418 located on the floor of the recess 408. The thermally conductive pad 418 is thermally connected to a thermally conductive pad 420 on the base of the package. The LED chip's electrode pads are electrically connected to corresponding electrode contact pads 414 and 416 on the floor of the package using bond wires 422 and 424 and the recess 418 is completely filled with a transparent silicone 426 which is loaded with a mixture of a yellow to green-emitting phosphor, optionally an orange to red-emitting phosphor, and a red-emitting phosphor such that the exposed surfaces of the LED chip 210 are covered by the phosphor/silicone material mixture. To enhance the emission brightness of the device, the walls of the recess 408 are inclined and have a light reflective surface.

Figure 5:
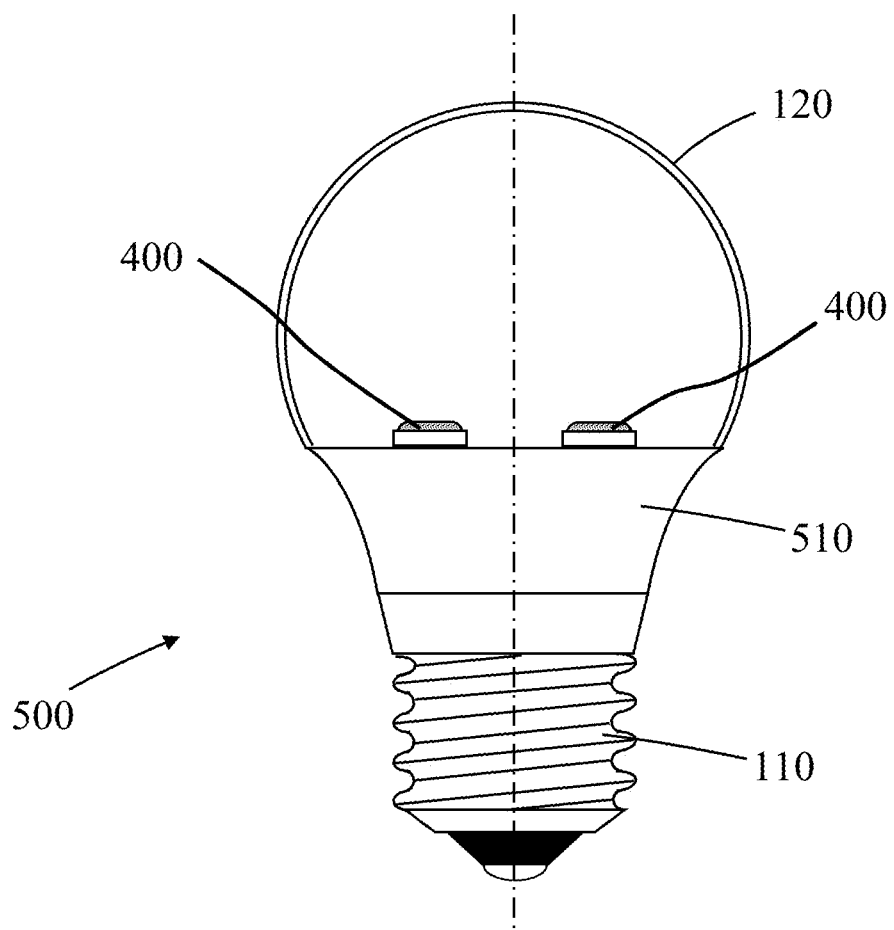
FIG. 5 is a schematic representation of an LED light bulb incorporating the light emitting device of FIGS. 4A and 4B.

FIG. 5 illustrates a partial cross-sectional side view of an LED A-Series lamp (bulb) 500 in accordance with an embodiment of the invention that incorporates light emitting devices of FIGS. 4A and 4B. The LED lamp (bulb) 500 is intended to be an energy efficient replacement for an incandescent A19 light bulb and can be configured to generate 550 lm of light at full power (undimmed) with a CCT of 2700 K and a CRI Ra of 80 and is configured such that its CCT decreases as power to the device is reduced, i.e. as the device is dimmed. The LED lamp 100 is nominally rated at 4 W. The LED lamp 500 comprises a lighting base 510 that includes a screw base 110. Screw base 110 is configured to fit within standard light bulb sockets, e.g. implemented as a standard Edison screw base. An envelope 120 may extend around the upper portion of the LED lighting device 500. The envelope 120 is a light-transmissive material (e.g. glass or plastic) that provides protective and/or diffusive properties for the LED lighting device 500.

Red-Emitting Phosphor

As described above, the inventors have discovered that use of a red-emitting phosphor having a photoluminescence characteristic with an enhanced level of "blue quenching", compared with known phosphors, in particular yellow to green emitting phosphors, enables LED-based devices and LED-filaments to be implemented that exhibit levels of "warm dimming" that resemble those of a traditional incandescent light source. More particularly, the inventors postulate that it is the reduction of conversion efficiency (CE) with increasing excitation energy (blue photon density) that has the biggest effect, though enhanced changes of chromaticity CIE x and CIE y of light generated by the red phosphor with increasing excitation (blue) photon density also contribute to the "warm dimming" effect. In addition, the red-emitting phosphor of the invention can also show enhanced levels of "thermal quenching"—decrease of emission intensity and/or chromaticity CIE x and CIE y change with an increase in temperature—and by careful thermal management of the device/filament "thermal quenching" can be used to increase the CCT change on dimming.

Group IIA/IIB Selenide Sulfide-Based Red-Emitting Phosphors

Examples of red-emitting phosphors that exhibit "blue quenching" and are suitable for the invention are Group IIA/IIB selenide sulfide-based phosphor materials having a composition $M_{1-y}Se_{1-x}S_x:Eu_y$, wherein M is at least one of Mg, Ca, Sr, Ba and Zn, $0<x<1.0$ and $0.0005 \leq y<0.005$. A particular example of this phosphor material is CSS phosphor $(CaSe_{1-x}S_x:Eu_y)$. Details of CSS phosphors are provided in co-pending U.S. patent application Ser. No. 15/282,551 filed 30 Sep. 2016, which is hereby incorporated by reference in its entirety. It is envisaged that the CSS narrow-band red phosphors described in U.S. patent application Ser. No. 15/282,551 can be used in the present invention.

Figure 6:
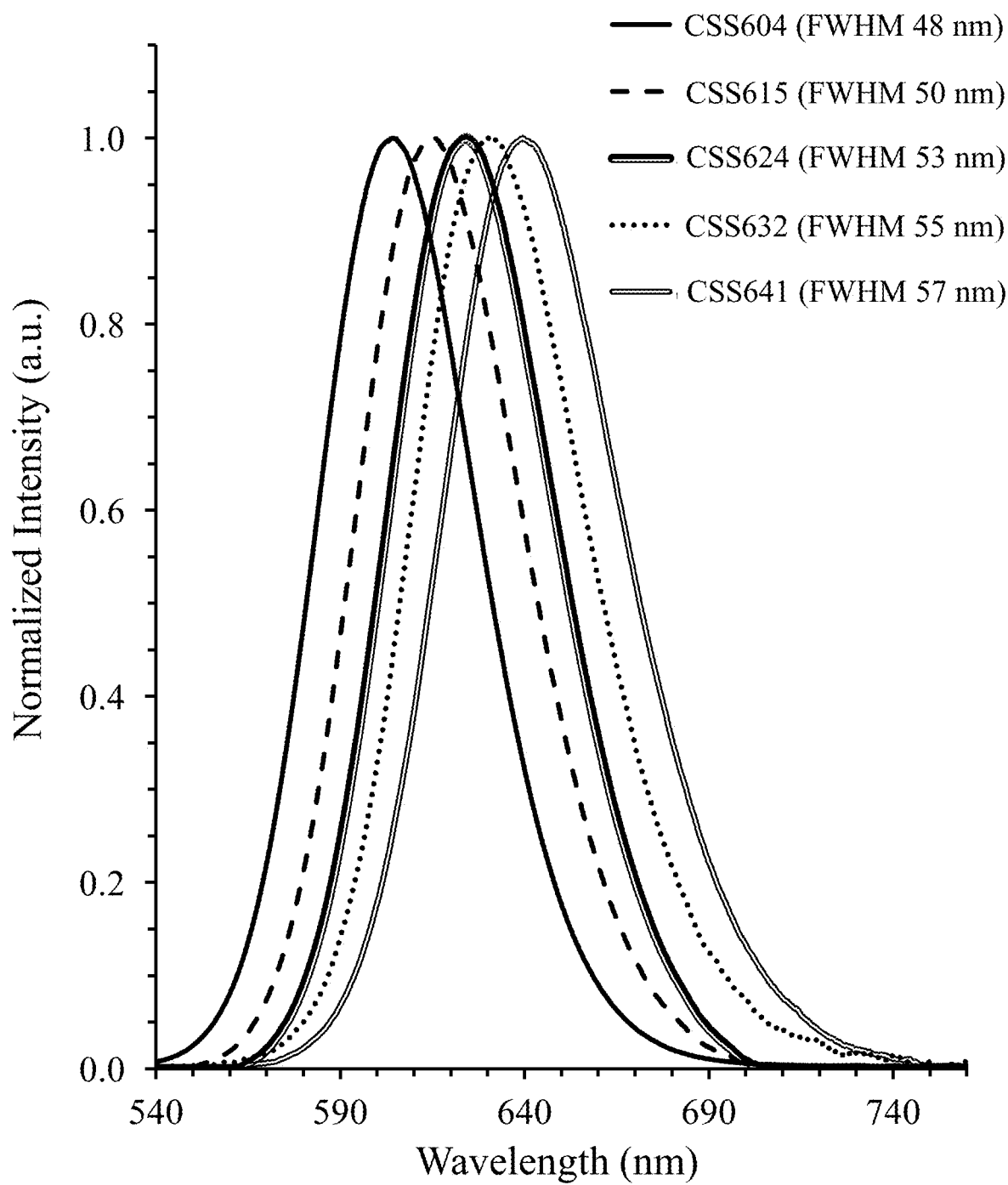
FIG. 6 shows normalized emission spectra of red-emitting CSS ($Ca_{1-y}Se_{1-x}S_x:Eu_y$) phosphors for differing ratios of S/Se.

FIG. 6 shows normalized emission spectra of CSS phosphors for differing ratios of S/Se, the emission peak can be tuned from 600 nm to 650 nm by the ratio of S/Se in the composition and exhibits a narrow-band red emission spectrum with Full Width Half Maximum (FWHM) typically in the range from ~48 nm to ~60 nm (longer wavelength typically has a larger FWHM value). For comparison, a CASN red nitride phosphor (Calcium Aluminum Silicon Nitride based phosphor—general composition $CaAlSiN_3:Eu^{2+}$) typically has a FWHM of ~80 nm. As is known, CASN red phosphors are commonly used in LED applications. Note that x varies over a range from about 0.05 to about 0.8 for the compositions shown in FIG. 1—the higher peak wavelengths corresponding to the larger values of x; that is, as the amount of S increases this shifts the emission peak to a higher wavelength. Note that the notation CSS630 used herein represents the phosphor type (CSS) followed by the peak emission wavelength in nanometers (630). The same notation rule applies to the other phosphor types, such as CSS634 for example.

CSS phosphor particles can be synthesized from purified $CaSeO_4$ and $CaSO_4$ in a mild $H_2$ (gas) environment (for example ~5% $H_2/N_2$).

The CSS phosphor particles can be coated with one or more oxides, for example:

aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition, the narrow-band red phosphor particles may be coated with one or more flourides, for example: calcium fluoride ($CaF_2$), magnesium fluoride ($MgF_2$), zinc fluoride ($ZnF_2$), aluminum fluoride ($AlF_3$) or titanium fluoride ($TiF_4$). In embodiments, the coatings may be a single layer, or multiple layers with combinations of the aforesaid coatings. The combination coatings may be coatings with an abrupt transition between the first and second materials, or may be coatings in which there is a gradual transition from the first material to the second material thus forming a zone with mixed composition that varies through the thickness of the coating. The thickness of the coating may typically be in the ranges 100 nm to 5 µm, 50 nm to 100 nm, 100 nm to 500 nm, 500 nm to 1 µm, or 1 µm to 2 µm. Coated CSS narrow-band red phosphor particle samples used in the examples herein are coated with approximately 1 µm of amorphous alumina ($Al_2O_3$).

The particles can be coated by a CVD process in a fluidized bed reactor. In a typical coating process, the phosphor powder is loaded into the reactor and heated to 100-250° C., preferably 200° C., under $N_2$ gas flow. When an oxide coating is to be deposited, a metal organic oxide precursor MO such as TrimethylAluminum (TMA), Titanium tetra-chloride ($TiCl_4$), Silicon tetra-chloride ($SiCl_4$), or DimethylZinc (DMZ) was introduced in to the reactor with a $N_2$ carrier gas through a bubbler. $H_2O$ vapor was also introduced into the reactor to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding $H_2O$ at a rate of 2 to 7 g/hour. These conditions can produce dense and pinhole free coatings and these conditions are able to produce dense substantially pin-hole free coatings of uniform thickness, with a theorized percentage solid space (percentage bulk density) of greater than 95% and in embodiments greater than 97% and in embodiments greater than 99%. In this patent specification, percentage solid space=(bulk density of the coating/density of the material within a single particle)× 100. It will be understood that the percentage solid space (% solid space) provides a measure of the porosity of the coating resulting from pinholes.

The inventors have found that the amount of "blue quenching" and "thermal quenching" can be altered (tuned) by changing the amount of activator (Eu). TABLE 3 tabulates compositions of various sample red-emitting CSS phosphors of the invention.

TABLE 3

Red-emitting CSS ($Ca_{1-x}Se_{1-x}S_x:Eu_y$) phosphors

| Name | Composition x | Composition y | Wavelength $\lambda_p$ (nm) |
|---|---|---|---|
| CSS627H | ≈0.4 | 0.0040 | 627 ± 1.5 |
| CSS630L | ≈0.5 | 0.0015 | 630 ± 1.5 |
| CSS630M | ≈0.5 | 0.0020 | 630 ± 1.5 |
| CSS630H | ≈0.5 | 0.0030 | 630 ± 1.5 |
| CSS634L | ≈0.6 | 0.0015 | 634 ± 1.5 |
| CSS634H | ≈0.6 | 0.0030 | 634 ± 1.5 |

Test Data—Red-Emitting Phosphor "Blue Quenching"

Phosphor "Blue Quenching" was measured using a phosphor cavity test. The cavity test method involves mixing phosphor powder with an uncurable optical encapsulant (Silicone) and placing the mixture in a 5630 cavity (5.6 mm×3.0 mm) containing a 0.5 W blue LED (dominant wavelength 454 nm) and measuring total light emission in an integrating sphere.

Figure 7:
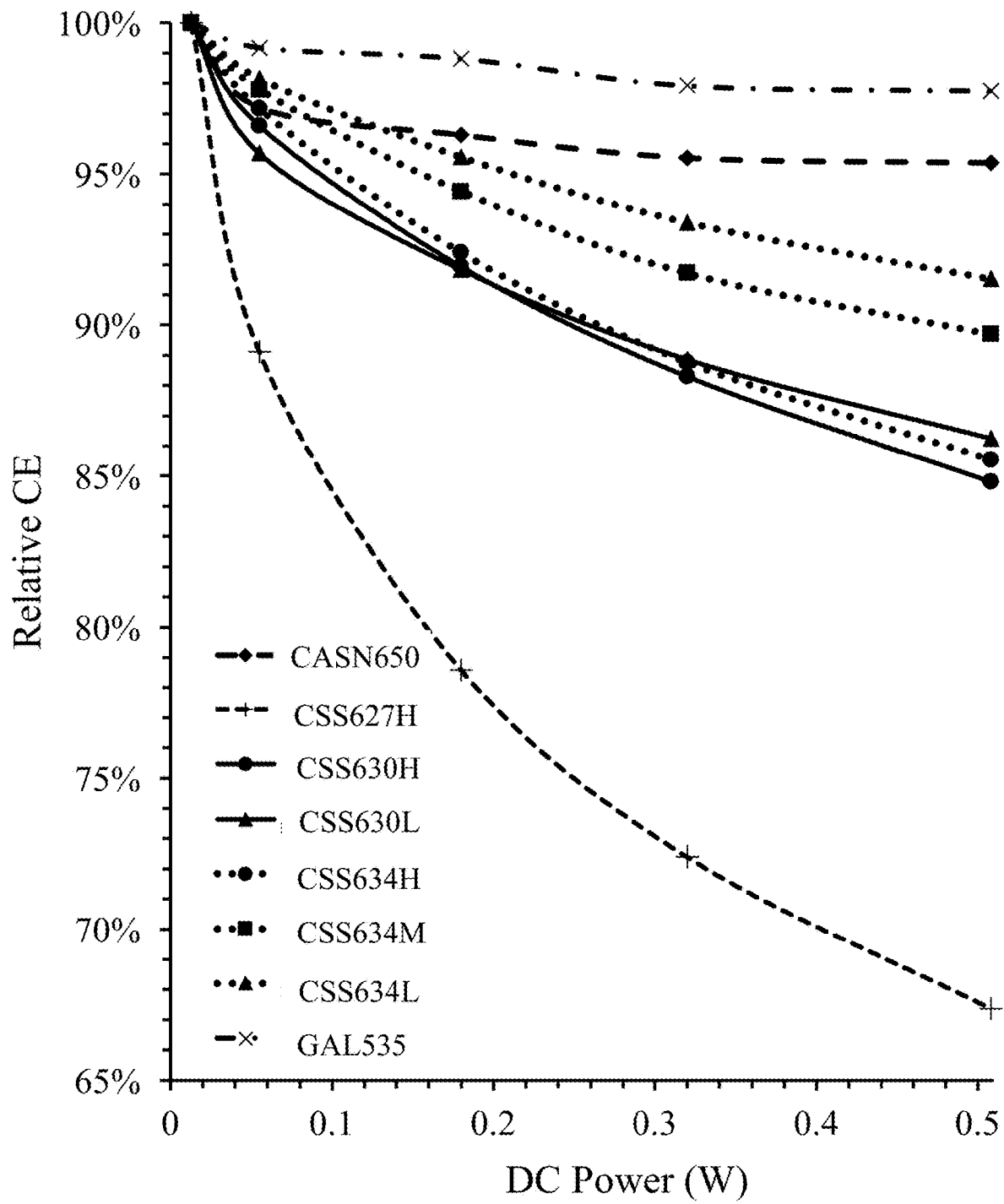
FIG. 7 shows measured Relative Conversion Efficiency (CE) versus DC power (W) for red-emitting phosphors: (i) CSS627H, (ii) CSS630L, (iii) CSS630H, (iv) CSS634L, (v) CSS634M, (vi) CSS634H, (vii) CASN650 and (viii) green-emitting phosphor GAL535.
Figure 8:
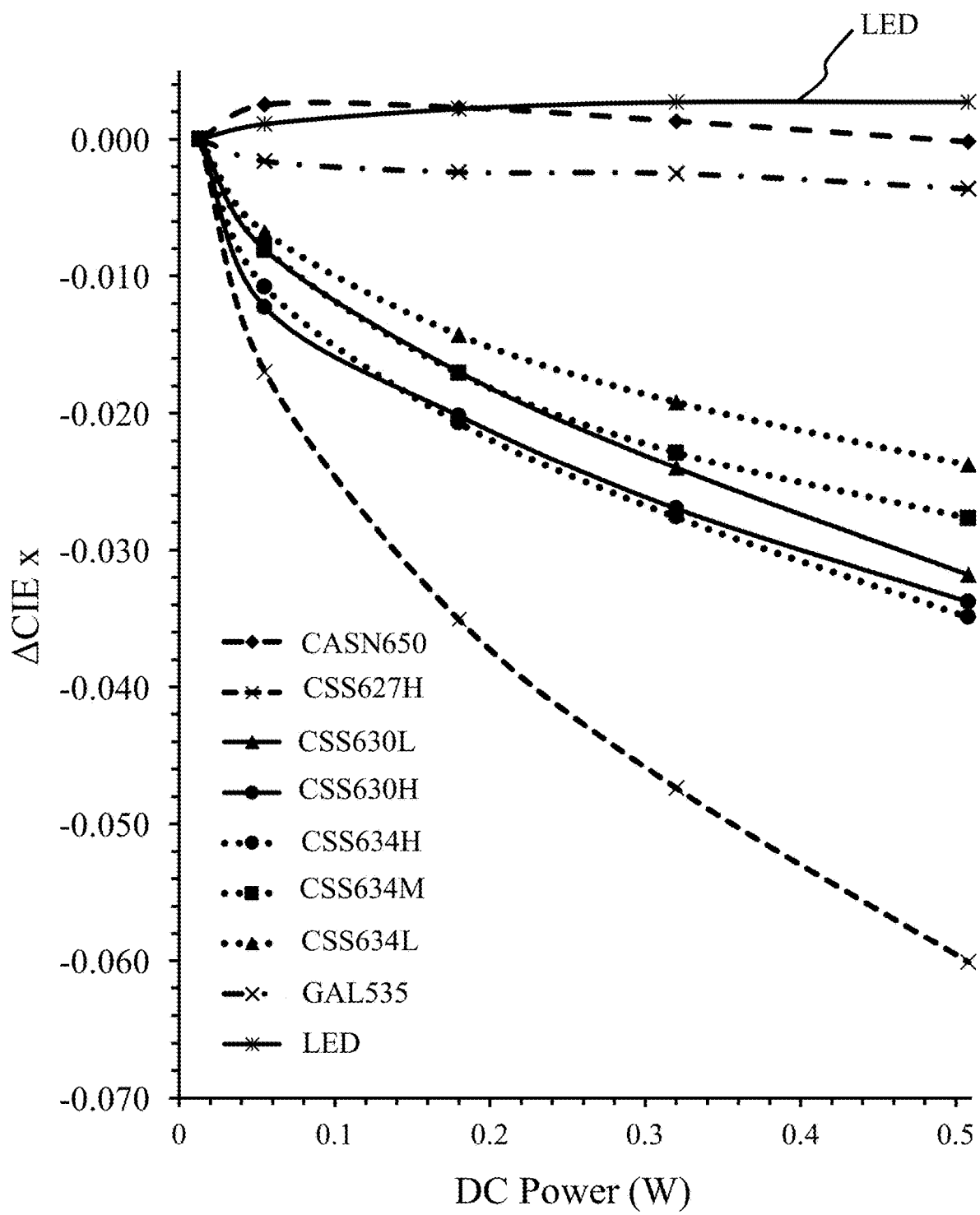
FIG. 8 shows measured relative change in chromaticity CIE x (ΔCIE x) versus DC Power (mA) for red-emitting phosphors: (i) CSS627H, (ii) CSS630L, (iii) CSS630H, (iv) CSS634L, (v) CSS634M, (vi) CSS634H, (vii) CASN650, (viii) green-emitting phosphor GAL535, and (ix) blue LED.
Figure 9:
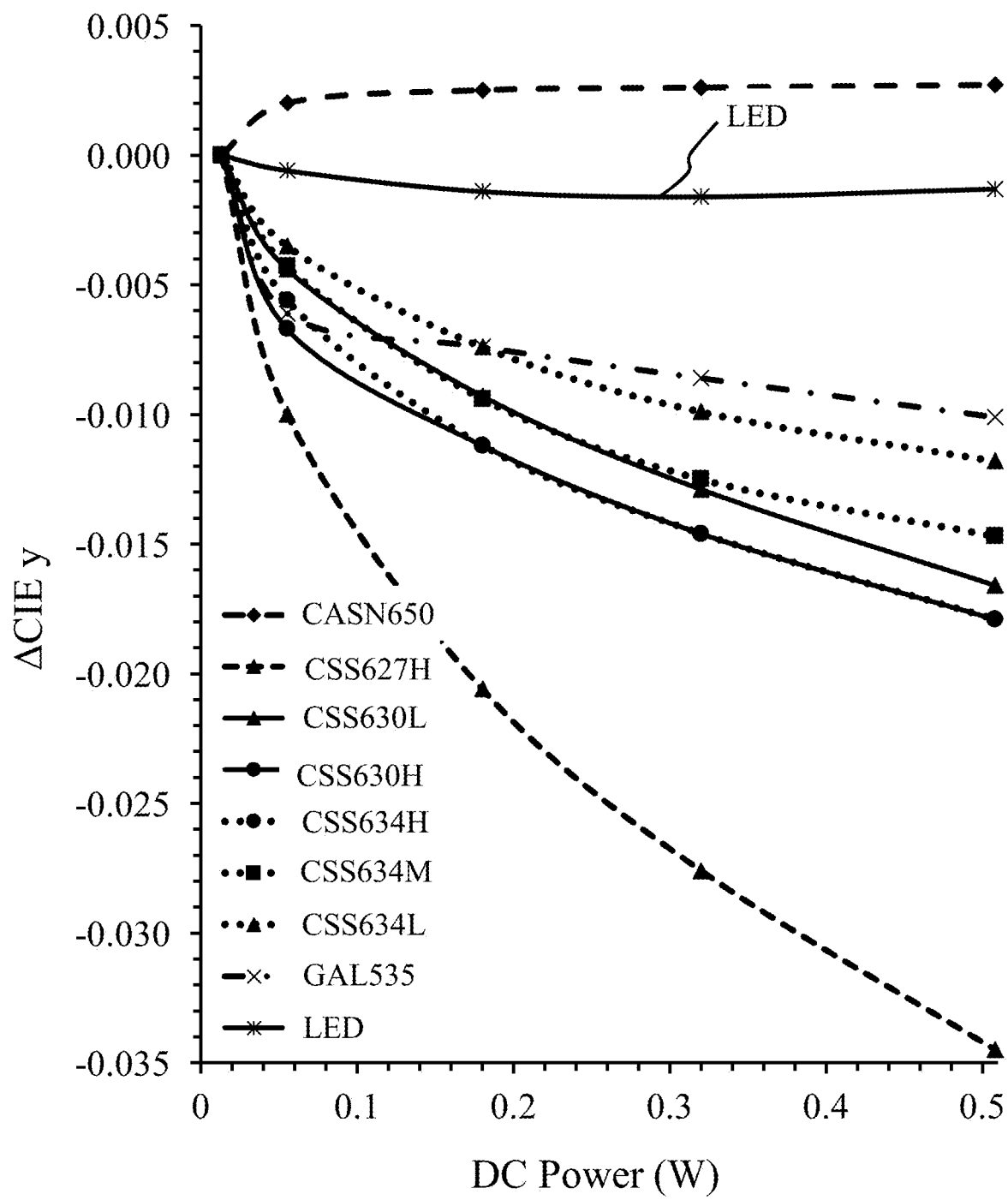
FIG. 9 shows measured relative change in chromaticity CIE y (ΔCIE y) versus DC Power (W) for red-emitting phosphors: (i) CSS627H, (ii) CSS630L, (iii) CSS630H, (iv) CSS634L, (v) CSS634M, (vi) CSS634H, (vii) CASN650, (viii) green-emitting phosphor GAL535, and blue LED.

FIGS. 7 to 9 show measured cavity test data for a cavity for various CSS red phosphors (17 wt % phosphor in encapsulant) and indicate the effect of activator (Eu) concentration on "Blue Quenching". For comparison, the figures also include data for red-emitting CASN650 phosphor and green-emitting GAL535 phosphor. More particularly, FIG. 7 shows relative Conversion Efficiency (CE) (%)—relative to the CE at the lowest power (0.013 W)—versus LED DC Power (W) for red-emitting phosphors: (i) CSS627H (Eu=0.0040), (ii) CSS630L (Eu=0.0015), (iii) CSS630H (Eu=0.0030), (iv) CSS634L (Eu=0.0015), (v) CSS634M (Eu=0.0020), (vi) CSS634H (Eu=0.0030), (vii) CASN650 and (viii) green-emitting phosphor GAL535. FIG. 8 shows change in chromaticity CIE x (ΔCIE x)—relative to CIE x at the lowest power (0.013 W)—versus LED DC Power (W) for red-emitting phosphors: (i) CSS627H, (ii) CSS630L, (iii) CSS630H, (iv) CSS634L, (v) CSS634M, (vi) CSS634H, (vii) CASN650, (viii) green-emitting phosphor GAL535 and (ix) blue LED. FIG. 9 shows change of chromaticity CIE y (ΔCIE y)—relative to CIE y at the lowest power (0.013 W)—versus LED DC Power (W) for red-emitting phosphors: (i) CSS627H, (ii) CSS630L, (iii) CSS630H, (iv) CSS634L, (v) CSS634M, (vi) CSS634H, (vii) CASN650, (viii) green-emitting phosphor GAL535, and (ix) blue LED.

Table 4 tabulates measured cavity test data of relative CE (%) as a function of LED DC Power (W) for red-emitting phosphors: (i) CSS627H, (ii) CSS630L, (iii) CSS630H, (iv) CSS634L, (v) CSS634M, (vi) CSS634H, (vii) CASN650 and (viii) green-emitting phosphor GAL535.

TABLE 4

Measured 5630 cavity test data of relative CE (%) with LED DC Power (W)

| | LED DC Power (W) | | | | | Reduction in CE from 2.5% power to full power (%) |
|---|---|---|---|---|---|---|
| | 0.013 | 0.055 | 0.180 | 0.320 | 0.508 | |
| CASN650 | 100.0 | 97.2 | 96.3 | 95.5 | 95.4 | 4.6 |
| CSS627H | 100.0 | 89.1 | 78.6 | 72.4 | 67.4 | 32.6 |
| CSS630H | 100.0 | 96.6 | 91.9 | 88.3 | 84.8 | 15.2 |
| CSS630L | 100.0 | 95.7 | 91.8 | 88.9 | 86.3 | 13.7 |
| CSS634H | 100.0 | 97.2 | 92.4 | 88.8 | 85.5 | 14.5 |
| CC634M | 100.0 | 97.8 | 94.4 | 91.7 | 89.7 | 10.3 |
| CSS634L | 100.0 | 98.2 | 95.6 | 93.4 | 91.5 | 8.5 |
| GAL535 | 100.0 | 99.2 | 98.8 | 97.9 | 97.7 | 2.3 |

As can be seen from TABLE 4 and FIG. 7, the relative CE (Conversion efficiency) decreases with increasing LED DC power; that is the conversion efficiency of the phosphor decreases with increasing blue (excitation) photon density— "Blue Quenching". In other words as the blue photon density increases the phosphor produces relatively less photoluminescence light compared with the increase in the photon density. Moreover, it will be apparent that the CSS phosphors of the invention show a significantly greater reduction in relative CE compared with CASN650. For example, the decrease of relative CE for the CSS phosphors of the invention are between 8.5% (CSS634L) and 32.6% (CSS627H) compared with a reduction of relative CE of only 4.6% for CASN650 and 2.3% for GAL535 for a change in DC power from 0.013 W (2.6% full power) to 0.508 W (100% full power). Furthermore, as evidenced by the data for the CSS634L to CSS634H series of phosphors the "Blue Quenching" effect increases with increasing activator (Eu) content. As will be explained further, the use of a red-emitting phosphor having such "blue quenching" in a white LED or white LED-Filament in combination with a green-emitting phosphor can result in a significant decrease of CCT on dimming (i.e. a reduction in blue photon power density) since the relative proportion of red light to green light will increase on dimming.

TABLE 5 tabulates measured cavity test data of change in chromaticity CIE x (ΔCIE x)—relative to CIE x at the lowest power (0.013 W)—as a function of LED DC Power (W) for red-emitting phosphors: (i) CSS627H, (ii) CSS630L, (iii) CSS630H, (iv) CSS634L, (v) CSS634M, (vi) CSS634H, (vii) CASN650 and (viii) green-emitting phosphor GAL535.

TABLE 5

Measured cavity test data of change in chromaticity CIE x (ΔCIE x) with LED DC Power (W)

| Phosphor | LED DC Power (W) | | | | |
|---|---|---|---|---|---|
|  | 0.013 | 0.055 | 0.180 | 0.320 | 0.508 |
| CASN650 | 0 | 0.0025 | 0.0023 | 0.0013 | −0.0002 |
| CSS627H | 0 | −0.0170 | −0.0351 | −0.0474 | −0.0601 |
| CSS630H | 0 | −0.0123 | −0.0202 | −0.0270 | −0.0338 |
| CSS630L | 0 | −0.0081 | −0.0170 | −0.0240 | −0.0318 |
| CSS634H | 0 | −0.0108 | −0.0207 | −0.0276 | −0.0349 |
| CC634M | 0 | −0.0080 | −0.0171 | −0.0229 | −0.0277 |
| CSS634L | 0 | −0.0068 | −0.0143 | −0.0192 | −0.0238 |
| GAL535 | 0 | −0.0016 | −0.0024 | −0.0025 | −0.0036 |

As can be seen from TABLE 5 and FIG. 8, the change in chromaticity CIE x (ΔCIE x) decreases with increasing LED DC Power, that is the color of the photoluminescence light generated by the phosphor changes with blue photon density. Moreover, it will be apparent that the CSS phosphors of the invention show a significantly greater change (decrease) of ΔCIE x compared with CASN650. For example, the decrease of ΔCIE x for the CSS phosphors of the invention are between −0.0238 (CSS634L) and −0.0601 (CSS627H) compared with a decrease of ΔCIE x of only −0.0002 for CASN650. Furthermore, as is evidenced by the data for the CSS634L to CSS634H series of phosphors the decrease of color ΔCIE x increases with increasing activator (Eu) content. FIG. 8 also includes data for the blue LED and indicates that there is very a small change of ΔCIE x for the blue LED with DC Power.

TABLE 6 tabulates measured cavity test data of change in chromaticity CIE y (ΔCIE y)—relative to CIE y at the lowest power (0.013 W)—as a function of LED DC Power (W) for red-emitting phosphors: (i) CSS627H, (ii) CSS630L, (iii) CSS630H, (iv) CSS634L, (v) CSS634M, (vi) CSS634H, (vii) CASN650 and (viii) green-emitting phosphor GAL535.

TABLE 6

Measured cavity test data of change of chromaticity CIE y (ΔCIE y) with LED DC Power (W)

| Phosphor | LED DC Power (W) | | | | |
|---|---|---|---|---|---|
|  | 0.013 | 0.055 | 0.180 | 0.320 | 0.508 |
| CASN650 | 0 | 0.0020 | 0.0025 | 0.0026 | 0.0027 |
| CSS627H | 0 | −0.0100 | −0.0206 | −0.0276 | −0.0345 |
| CSS630H | 0 | −0.0067 | −0.0112 | −0.0146 | −0.0179 |
| CSS630L | 0 | −0.0044 | −0.0093 | −0.0129 | −0.0166 |
| CSS634H | 0 | −0.0056 | −0.0112 | −0.0146 | −0.0179 |

TABLE 6-continued

Measured cavity test data of change of chromaticity CIE y (ΔCIE y) with LED DC Power (W)

| Phosphor | LED DC Power (W) | | | | |
|---|---|---|---|---|---|
|  | 0.013 | 0.055 | 0.180 | 0.320 | 0.508 |
| CC634M | 0 | −0.0043 | −0.0094 | −0.0125 | −0.0147 |
| CSS634L | 0 | −0.0035 | −0.0074 | −0.0099 | −0.0118 |
| GAL535 | 0 | −0.0061 | −0.0074 | −0.0086 | −0.0101 |

As can be seen from TABLE 6 and FIG. 9 the change in chromaticity CIE y (ΔCIE y) decreases with increasing LED DC Power, that is the color of the photoluminescence light generated by the phosphor changes with blue photon density. Moreover, it will be apparent that the CSS phosphors of the invention show a significantly greater change (decrease) of ΔCIE y compared with CASN650. For example, the decrease of ΔCIE x for the CSS phosphors of the invention are between −0.0118 (CSS634L) and −0.0345 (CSS627H) compared with a increase of ΔCIE x of 0.0027 for CASN650. Furthermore, as is evidenced by the data for the CSS634L to CSS634H series of phosphors the decrease of color ΔCIE y increases with increasing activator (Eu) content. FIG. 9 also includes data for the blue LED and indicates that there is very a small change of ΔCIE y for the blue LED with DC Power.

Test Data—Red-Emitting Phosphor—"Thermal Quenching"

Phosphor "Thermal quenching" was measured using a phosphor powder test. The phosphor powder test involves placing phosphor powder on a temperature controllable stage and illuminating the phosphor powder with blue LED light of a constant power (dominant wavelength 454 nm) and measuring the emitted light.

Figure 10:
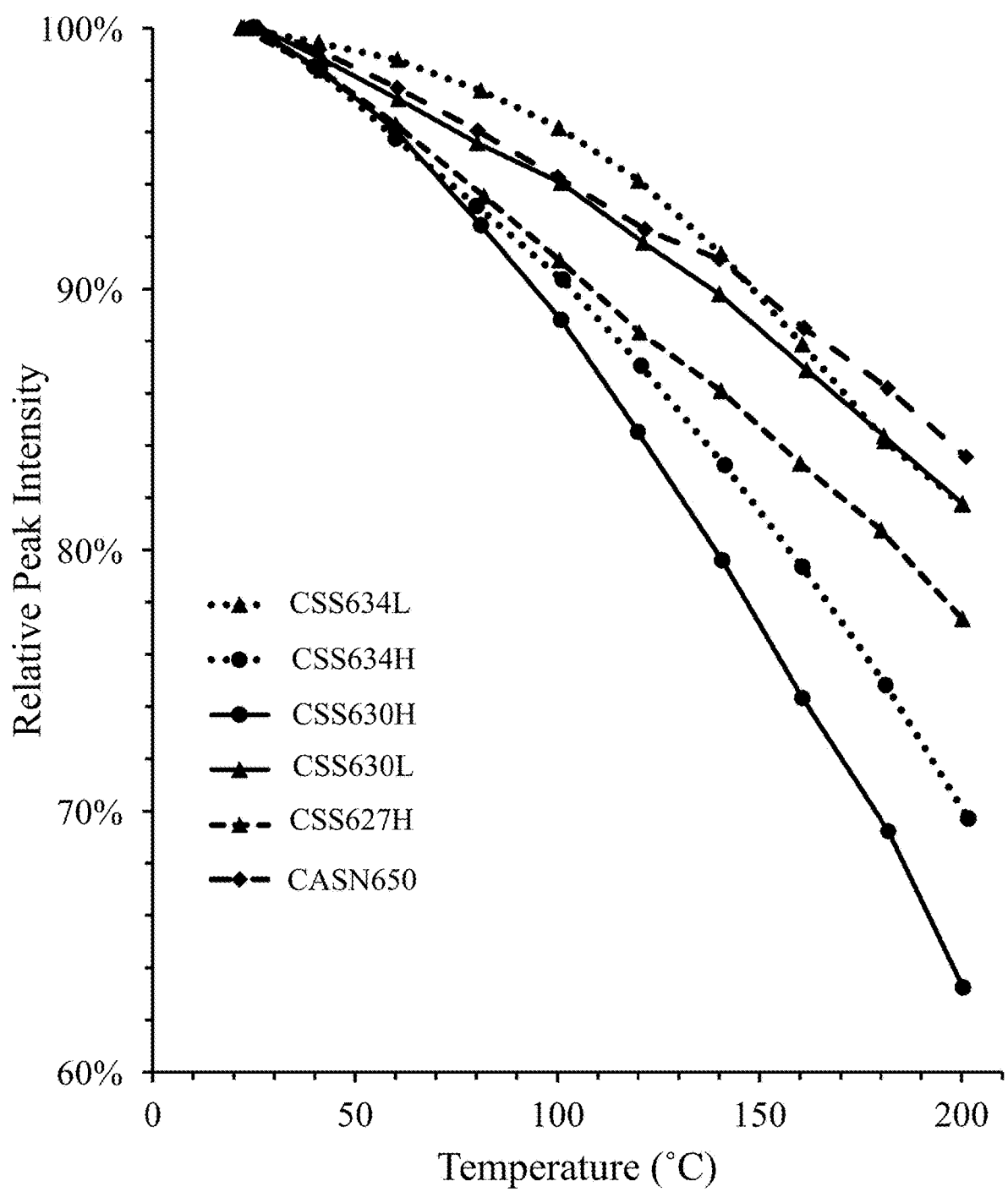
FIG. 10 shows measured Relative Peak intensity (%) versus Temperature (° C.) for red-emitting phosphors: (i) CSS627H, (ii) CSS630L, (iii) CSS630H, (iv) CSS634L, (v) CSS634H and (vi) CASN650.
Figure 11:
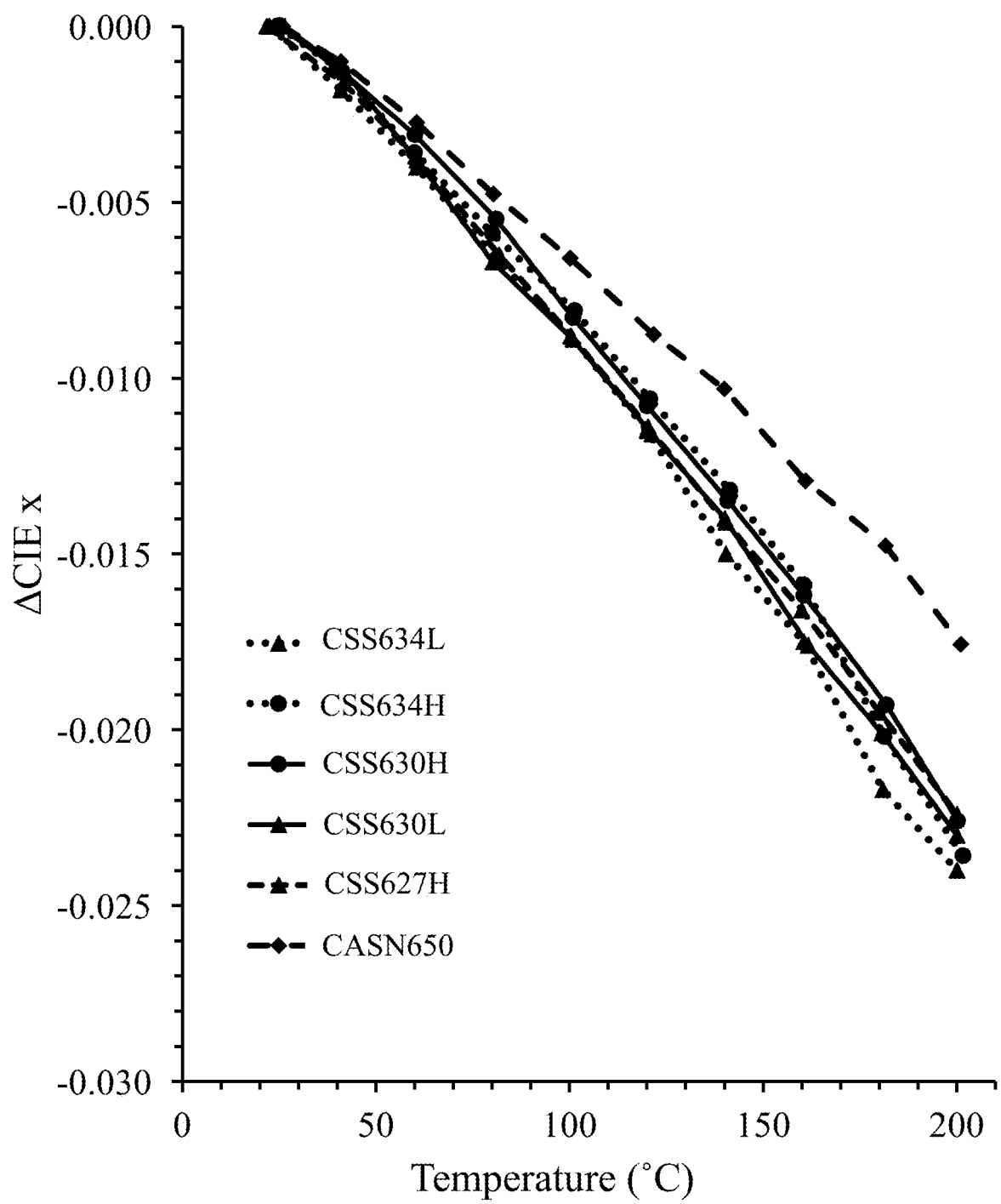
FIG. 11 shows measured relative change of chromaticity CIE x (ΔCIE x) versus Temperature (° C.) for red-emitting phosphors: (i) CSS627H, (ii) CSS630L, (iii) CSS630H, (iv) CSS634L, (v) CSS634H and (vi) CASN650.
Figure 12:
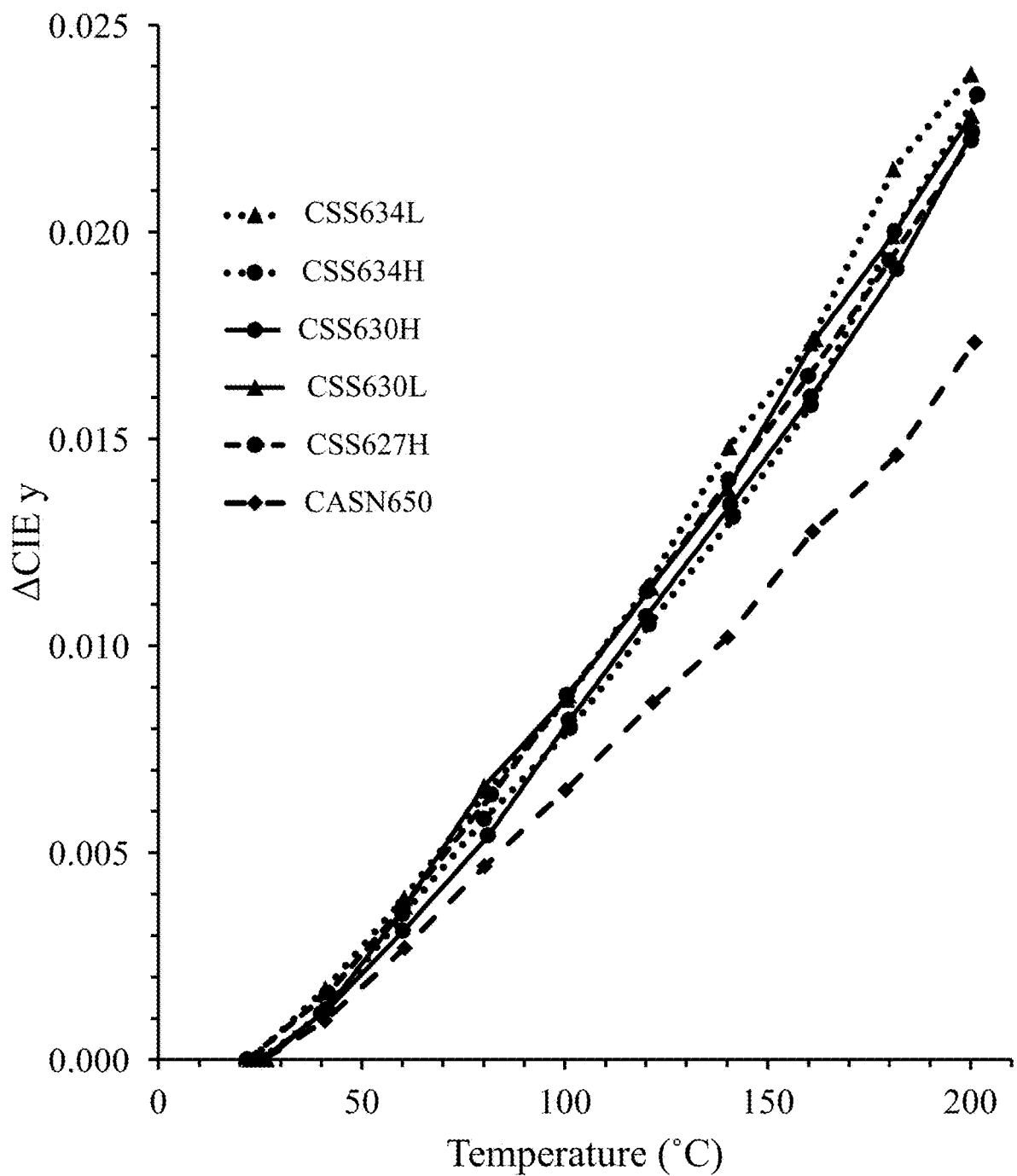
FIG. 12 shows measured change of chromaticity CIE y (ΔCIE y) versus Temperature (° C.) for red-emitting phosphors: (i) CSS627H, (ii) CSS630L, (iii) CSS630H, (iv) CSS634L, (v) CSS634H and (vi) CASN650.

FIGS. 10 to 12 show measured powder test data for various CSS red phosphors and indicate the effect of activator (Eu) concentration on "Thermal Quenching". For comparison, the figures also include data for red-emitting CASN650 phosphor. More particularly, FIG. 10 shows measured Relative Peak intensity (%)—relative to peak intensity at 25° C.—versus Temperature (° C.) for red-emitting phosphors: (i) CSS627H (Eu=0.0040), (ii) CSS630L (Eu=0.0015), (iii) CSS630H (Eu=0.0030), (iv) CSS634L (Eu=0.0015), (v) CSS634H (Eu=0.0030), and (vi) CASN650. FIG. 11 shows change in chromaticity CIE x (ΔCIE x)—relative to CIE x at 25° C.—versus temperature (° C.) for red-emitting phosphors: (i) CSS627H, (ii) CSS630L, (iii) CSS630H, (iv) CSS634L, (v) CSS634H, and (vi) CASN650. FIG. 12 shows change of chromaticity CIE y (ΔCIE y)—relative to CIE y at 25° C.—versus temperature (° C.) for red-emitting phosphors: (i) CSS627H, (ii) CSS630L, (iii) CSS630H, (iv) CSS634L, (v) CSS634H, and (vi) CASN650.

As can be seen from FIG. 10, the relative Peak intensity decreases with increasing temperature; indicating that the efficiency of the phosphor also decreases with temperature—"Thermal quenching". Moreover, it will be apparent that the CSS phosphors of the invention show a greater reduction in relative peak intensity compared with CASN650. For example, the decrease of relative peak intensity for the CSS phosphors of the invention are between 18.5% (CSS630L & CSS634L) and 36.5% (CSS627H) compared with a reduction of relative peak intensity of 17% for CASN650 for a change in temperature from about 25° C. to about 200° C. Furthermore, as evidenced by the data for the CSS634L and CSS634H phosphors and CSS630L and CSS630H the "Thermal Quenching" effect seems to increase with increasing activator (Eu) content.

As can be seen from FIG. 11, the change in chromaticity CIE x (ΔCIE x) decreases with increasing temperature, that is the color of the photoluminescence light generated by the phosphor changes with temperature. Moreover, it will be apparent that the CSS phosphors of the invention show a significantly greater change (decrease) of ΔCIE x compared with CASN650. For example, the decrease of ΔCIE x for the CSS phosphors of the invention are between −0.0230 and −0.0235 compared with a decrease of ΔCIE x of only −0.0018 for CASN650. Furthermore, as is indicated by the data for the CSS630L and CSS630H phosphors the decrease of color ΔCIE x seems to increase slightly with increasing activator (Eu) content.

As can be seen from FIG. 12, the change in chromaticity CIE y (ΔCIE y) decreases with increasing temperature, that is the color of the photoluminescence light generated by the phosphor changes with temperature. Moreover, it will be apparent that the CSS phosphors of the invention show a significantly greater change (increase) of ΔCIE y compared with CASN650. For example, the increase of ΔCIE y for the CSS phosphors of the invention are between 0.0225 and 0.024 compared with an increase of ΔCIE y of 0.0175 for CASN650. Furthermore, the data indicates that the increase of color ΔCIE y increase slightly with increasing activator (Eu) content.

Test Data—LED-Filament

Test data for an LED-filament in accordance with the invention will now be described. The LED-filament comprises a 38 mm×0.8 mm glass substrate comprising 31 serially connected LED chips (chip size 9×21 one thousandths of an inch, dominant wavelength 455 to 460 nm). The phosphor encapsulant comprises a mixture of GAL53 (92 wt %) and CSS630H (8 wt %).

Figure 16:
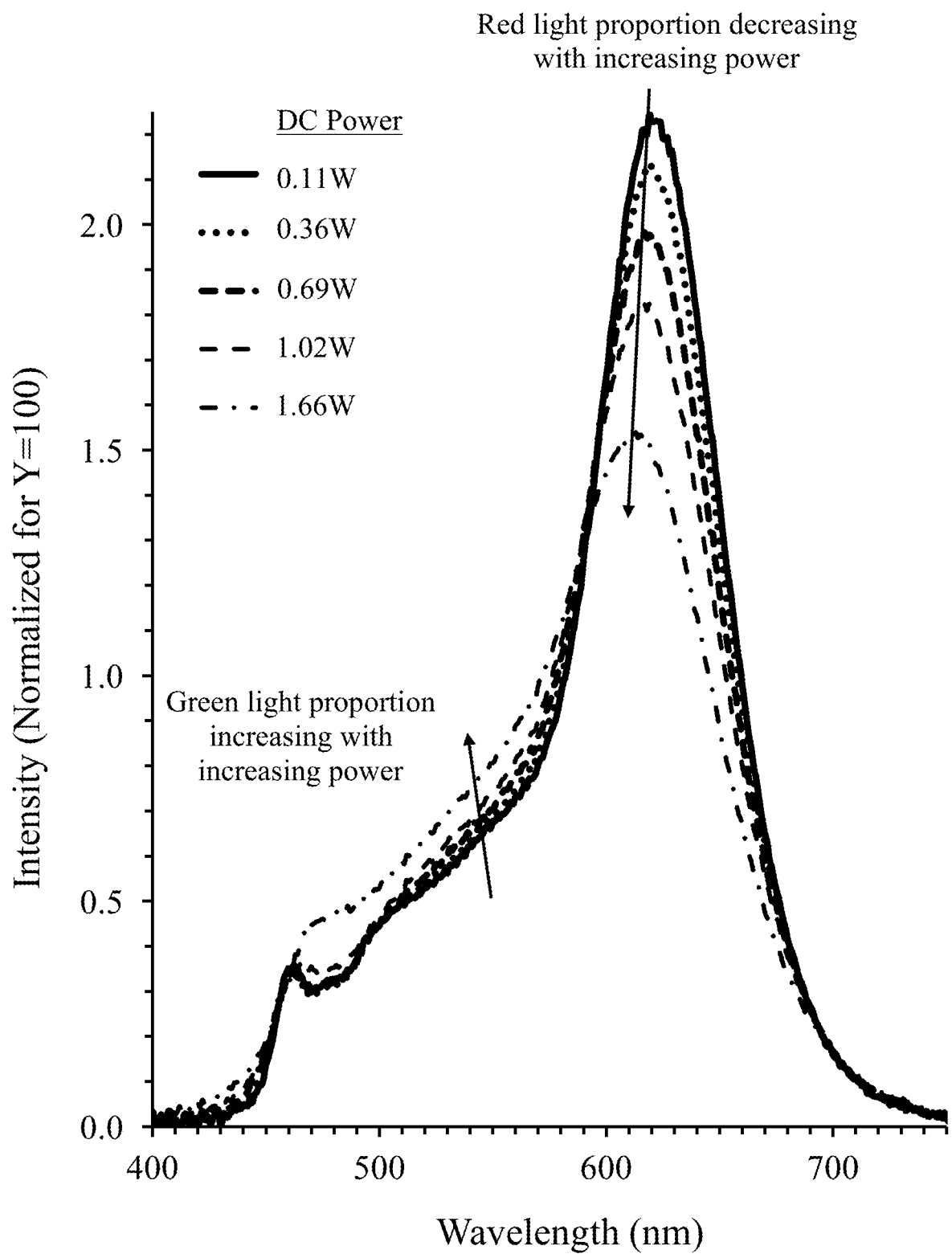
FIG. 16 shows measured emission spectra normalized intensity versus wavelength (nm) for an LED-Filament in accordance with the invention (CSS630H+GAL535) for different DC power (W)

TABLE 7 tabulates measured test data for an LED-filament in accordance with the invention. All data are measured at steady state conditions.

ing Index (CRI) (i) CRI Ra, (ii) CRI R8, and (iii) CRI R9 versus DC Power (W) for an LED-Filament in accordance with the invention; and FIG. 16 shows measured emission spectra normalized intensity versus wavelength (nm) for an LED-Filament in accordance with the invention for different DC power (W).

Figure 13:
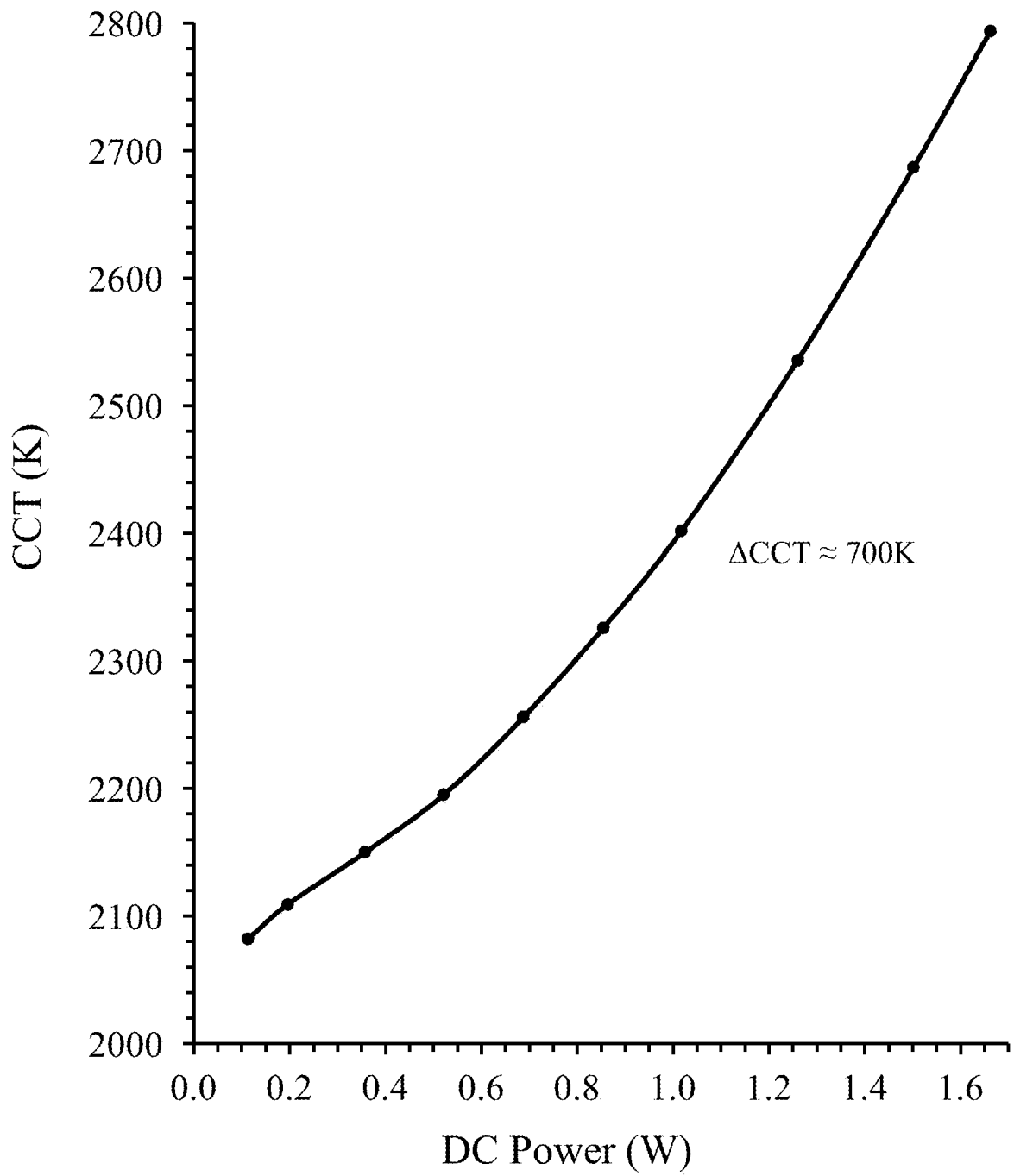
FIG. 13 measured CCT (K) versus DC Power (W) for an LED-filament in accordance with the invention (CSS630H+GAL535)
Figure 15:
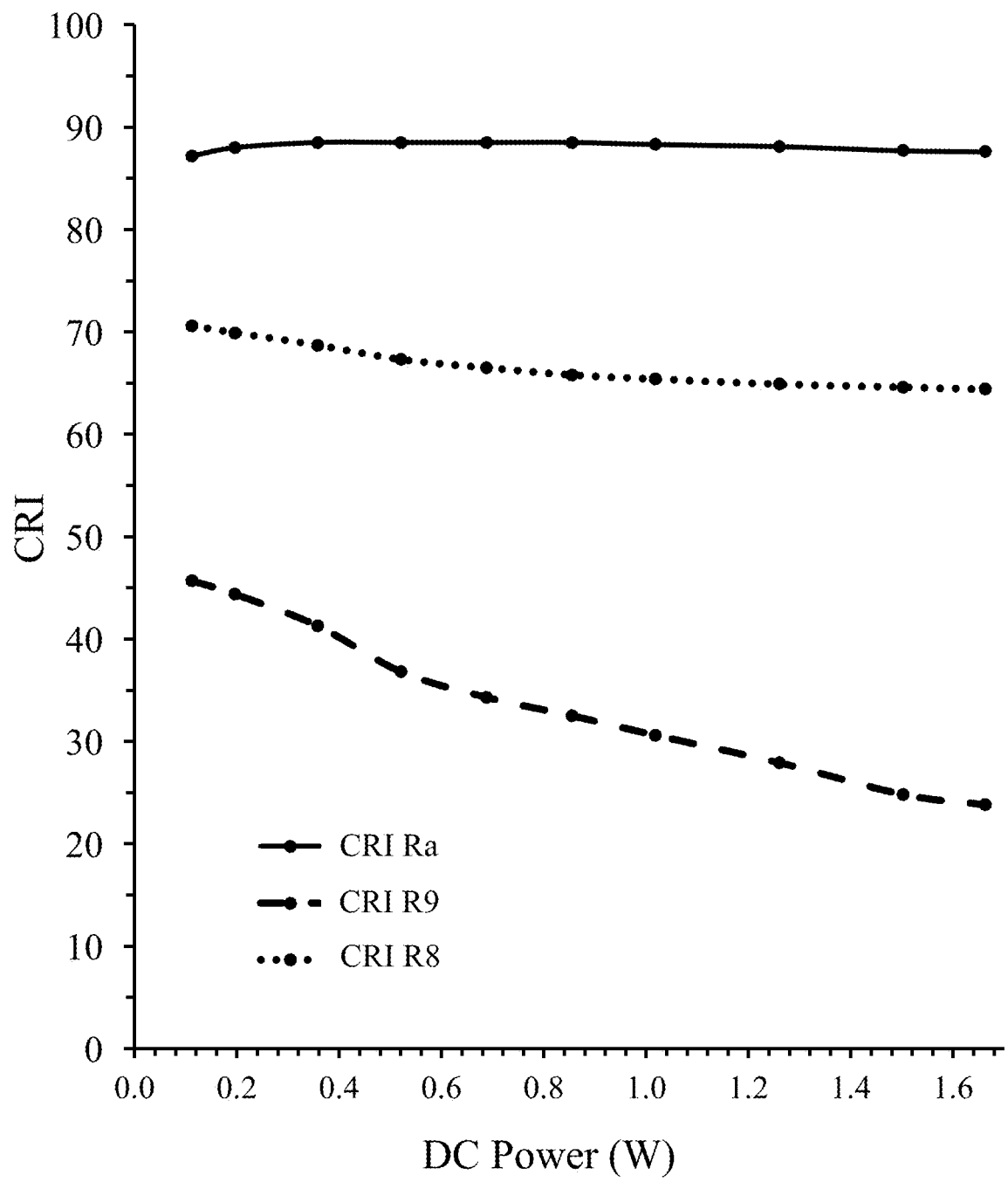
FIG. 15 shows measured color rendering index (CRI) (i) CRI Ra, (ii) CRI R8, and (iii) CRI R9 versus DC Power (W) for an LED-Filament in accordance with the invention (CSS630H+GAL535)

As can be seen from FIG. 13 and TABLE 7 the CCT of light generated by the LED-filament decreases from 2794K at full power (1.66 W) to 2082K at 7% of full power (0.11 W)—that is the LED-filament exhibits a warm dimming of 712K. FIG. 15 and TABLE 7 indicate that CRI Ra and CRI R8 remain generally constant on dimming while CRI R9 decrease from about 46 to about 24 on dimming.

Comparing the emission spectra of FIG. 16 for different DC powers, indicates that as the DC power is increased the relative proportion of red light decreases and is accompanied by an increase in the relative proportion of green light. There is no observable change in the proportion of blue light. To emphasize this change, each spectra has been normalized such each has a CIE 1931 XYZ relative luminance Y=100. The data are normalized using the CIE 1931 luminosity function y(λ) of a standard observer which takes account of the photopic response of an observer. As described above, the reason for the reduction in red light is due to the combined effects of "blue quenching" (i.e. reduction in relative conversion efficiency with increasing power) and "thermal quenching" (i.e. reduction in relative peak intensity with increasing temperature as a result LED heating with increased power). As shown in FIG. 7 since the green-emitting phosphor (GAL535) exhibits minimal "blue quenching" compared with the red-emitting phosphor this accounts for why the relative proportion of green light increases as the proportion of red light decreases. Furthermore, since the red-emitting phosphor is capable of being excited by green light, that is the red emitting phosphor can convert green light to red light, this may also contribute to the relative proportion of green light increasing as the proportion of red light decreases. In terms of color temperature (CCT), an increase in the relative proportion of green

TABLE 7

Measured test data for nominal 2700K LED-filament comprising GAL535 + CSS630L

| DC drive | | | | | Chromaticity | | CCT | CRI | | | ΔCCT |
|---|---|---|---|---|---|---|---|---|---|---|---|
| Voltage | Current | Power | Flux | Efficacy | | | | Ra | R8 | R9 | |
| (V) | (mA) | (W) | (lm) | (lm/W) | CIE x | CIE y | (K) | | | | (K) |
| 80.10 | 1.4 | 0.11 | 18.7 | 166.8 | 0.5115 | 0.4056 | 2082 | 87.2 | 70.6 | 45.7 | 712 |
| 80.81 | 2.4 | 0.20 | 31.3 | 160.1 | 0.5095 | 0.4070 | 2109 | 88.0 | 69.9 | 44.4 | 685 |
| 81.61 | 4.4 | 0.36 | 55.2 | 154.4 | 0.5063 | 0.4087 | 2150 | 88.5 | 68.7 | 41.3 | 644 |
| 82.03 | 6.4 | 0.52 | 77.0 | 147.8 | 0.5026 | 0.4101 | 2195 | 88.5 | 67.3 | 36.8 | 599 |
| 82.25 | 8.4 | 0.69 | 96.1 | 139.8 | 0.4978 | 0.4120 | 2256 | 88.5 | 66.5 | 34.3 | 538 |
| 82.32 | 10.4 | 0.85 | 112.4 | 131.5 | 0.4924 | 0.4138 | 2326 | 88.5 | 65.8 | 32.5 | 468 |
| 82.29 | 12.4 | 1.02 | 125.3 | 123.2 | 0.4866 | 0.4158 | 2402 | 88.3 | 65.4 | 30.6 | 392 |
| 82.11 | 15.4 | 1.26 | 139.0 | 110.3 | 0.4771 | 0.4186 | 2536 | 88.1 | 64.9 | 27.9 | 258 |
| 81.79 | 18.4 | 1.50 | 145.5 | 96.9 | 0.4668 | 0.4213 | 2687 | 87.7 | 64.6 | 24.8 | 107 |
| 81.55 | 20.4 | 1.66 | 145.6 | 87.6 | 0.4599 | 0.4230 | 2794 | 87.6 | 64.4 | 23.8 | 0 |

Figure 14:
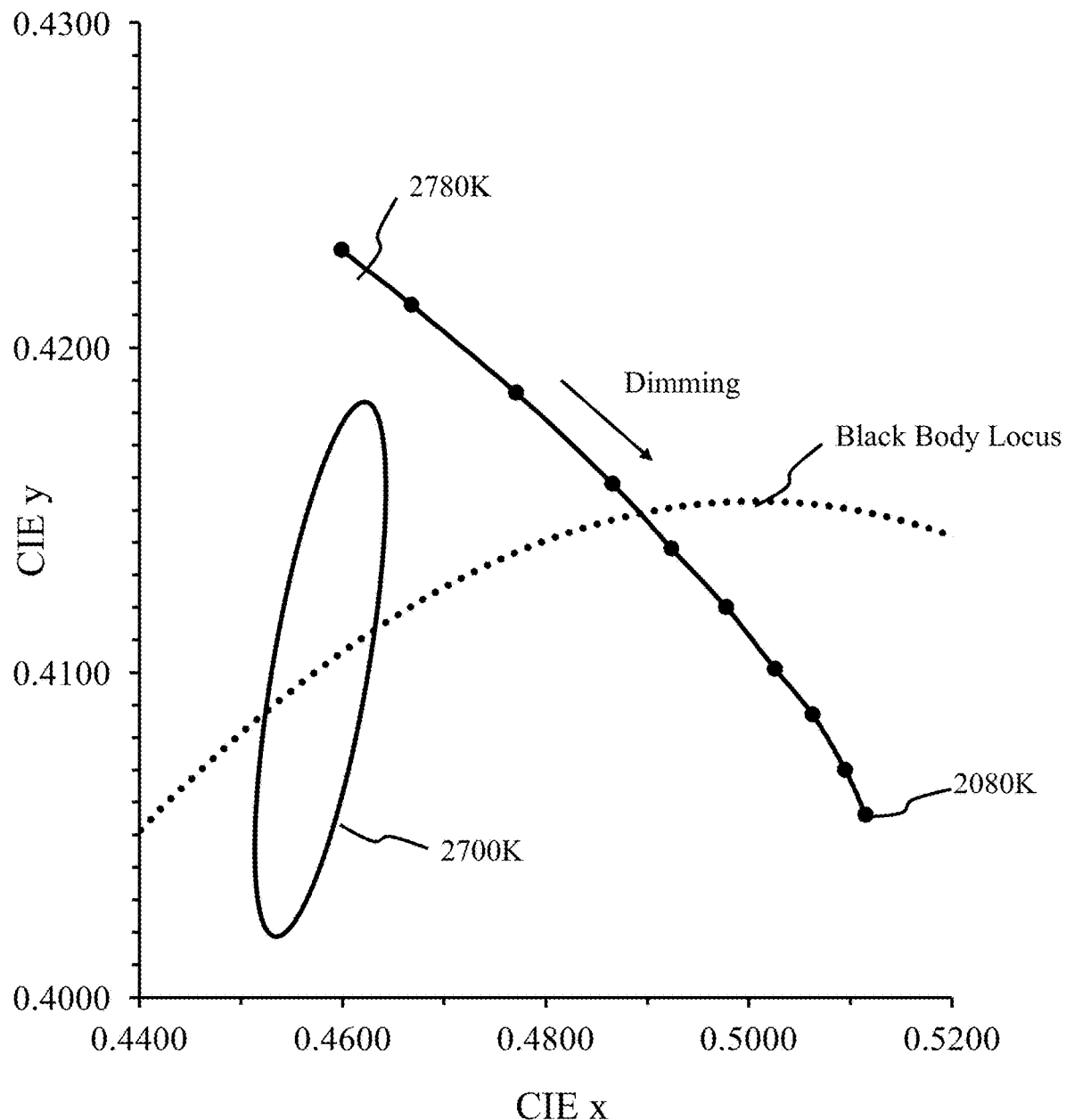
FIG. 14 shows measured chromaticity CIE y versus CIE x for (i) an LED-filament in accordance with the invention (CSS630H+GAL535) and the black body locus for reference.

FIGS. 13-16 show measured test data for an LED-filament in accordance with the invention comprising CSS630H+GAL535 for different DC drive conditions. More particularly, FIG. 13 shows measured CCT (K) versus DC Power (W) for an LED-filament in accordance with the invention; FIG. 14 shows measured chromaticity CIE y versus CIE x for an LED-filament in accordance with the invention, the black body locus for reference and 2700K MacAdam ellipse; FIG. 15 shows measured Color Renderlight accompanied by a decrease in the relative proportion of red light corresponds to an increase in CCT—that is as the DC power increases the CCT increases (FIG. 14). Conversely as the DC power is reduced, dimmed, the CCT decreases—"warm dimming".

Test Data—White LED

Test data for a white LED in accordance with the invention will now be described. The white LED comprises a Kaistar 2835 (28 mm×35 mm) cavity comprising a single blue LED chip (chip size 22×40 one thousandths of an inch—dominant wavelength 445 to 450 nm). The phosphor encapsulant comprises a mixture of GAL535 (89 wt %) and CSS630H (11 wt %). All data were tested using a pulse current arrangement to separate the effects of "blue quenching" and "thermal quenching".

TABLE 8 tabulates measured test data for a nominal 2700 K 2835 white LED in accordance with the invention.

TABLE 8

Measured test data for nominal 2700K 2835 white LED comprising GAL535 + CSS627H

| DC drive | | | | | Chromaticity | | CCT | CRI | | | ΔCCT |
|---|---|---|---|---|---|---|---|---|---|---|---|
| Voltage | Current | Power | Flux | Efficacy | | | | | | | |
| (V) | (mA) | (W) | (lm) | (lm/W) | CIE x | CIE y | (K) | Ra | R8 | R9 | (K) |
| 2.61 | 0.001 | 0.003 | 1.0 | 147.6 | 0.5001 | 0.4053 | 2187 | 87.5 | 61.6 | 23.3 | 435 |
| 2.62 | 0.005 | 0.013 | 2.4 | 145.6 | 0.4991 | 0.4060 | 2202 | 87.6 | 61.7 | 23.4 | 420 |
| 2.64 | 0.010 | 0.026 | 4.0 | 143.1 | 0.4977 | 0.4070 | 2223 | 87.8 | 61.9 | 23.5 | 399 |
| 2.66 | 0.015 | 0.040 | 5.7 | 140.6 | 0.4964 | 0.4079 | 2242 | 87.9 | 62.0 | 23.6 | 380 |
| 2.68 | 0.020 | 0.054 | 7.4 | 138.0 | 0.4950 | 0.4088 | 2262 | 88.0 | 62.1 | 23.7 | 360 |
| 2.75 | 0.040 | 0.110 | 14.1 | 127.9 | 0.4896 | 0.4125 | 2346 | 88.5 | 62.6 | 24.1 | 276 |
| 2.88 | 0.080 | 0.230 | 26.1 | 113.3 | 0.4804 | 0.4148 | 2467 | 88.2 | 62.7 | 20.5 | 155 |
| 2.93 | 0.100 | 0.293 | 31.5 | 107.4 | 0.4768 | 0.4156 | 2516 | 87.8 | 62.6 | 19.7 | 106 |
| 2.99 | 0.120 | 0.359 | 36.6 | 102.1 | 0.4736 | 0.4162 | 2561 | 87.6 | 62.4 | 18.3 | 61 |
| 3.07 | 0.150 | 0.460 | 43.7 | 95.0 | 0.4691 | 0.4167 | 2622 | 87.9 | 62.3 | 18.0 | 0 |

Figure 17:
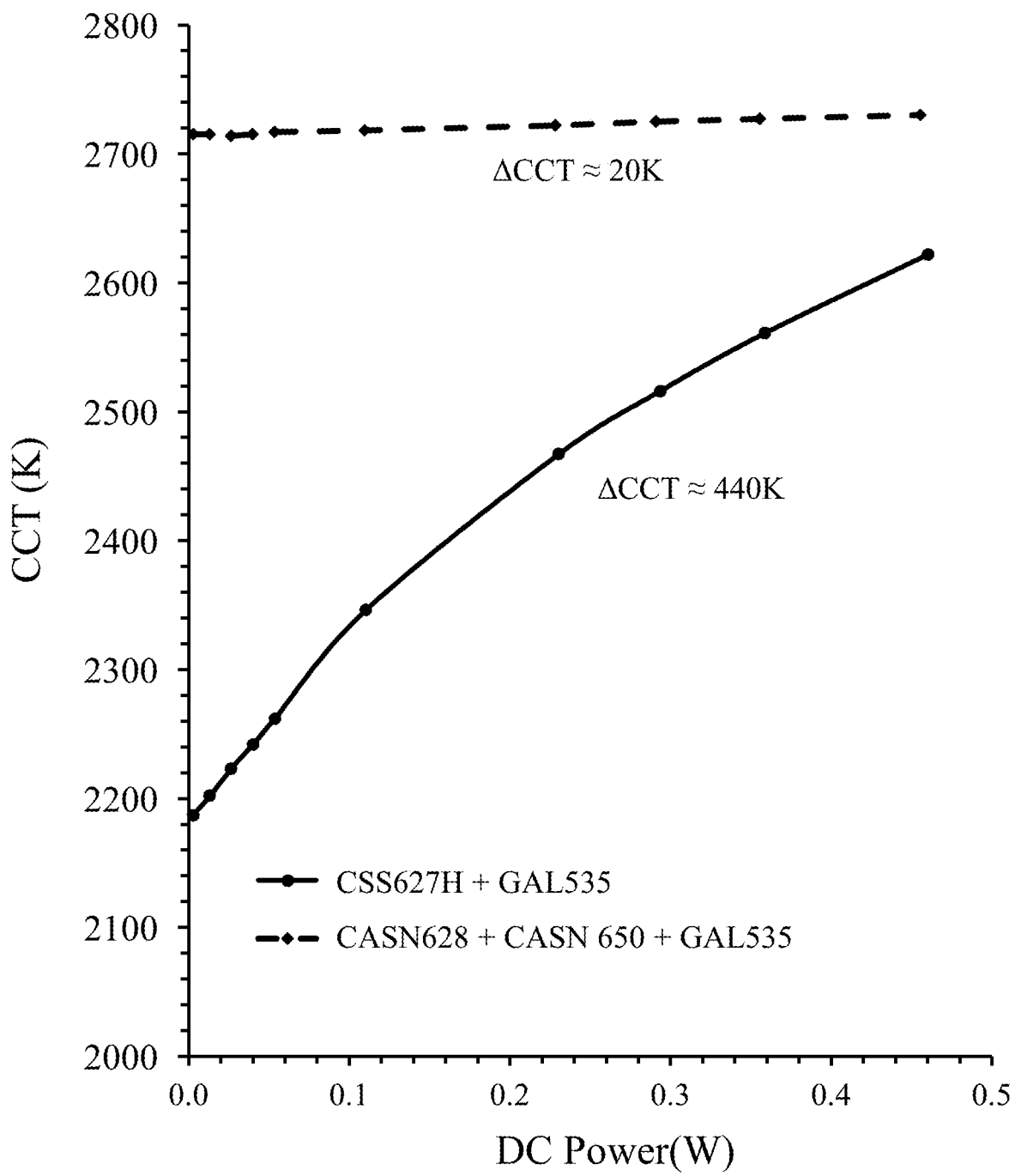
FIG. 17 shows measured CCT (K) versus DC Power (W) for (i) a white LED in accordance with the invention (CSS627H+GAL535), and (ii) a reference white LED (CASN628+CASN 650+GAL535)
Figure 18:
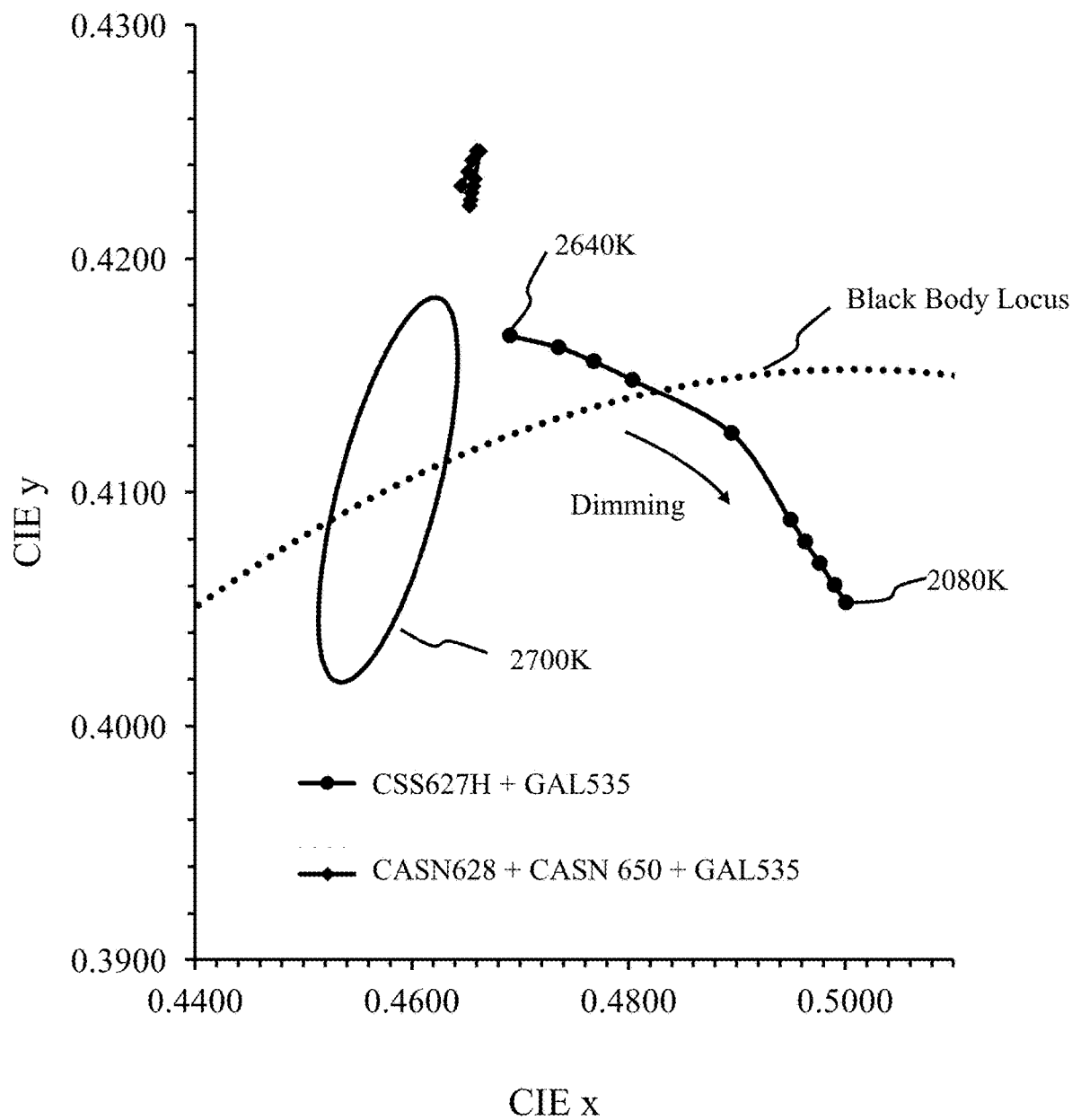
FIG. 18 shows measured chromaticity CIE y versus CIE x for (i) a white LED in accordance with the invention (CSS627H+GAL535), (ii) a reference white LED (CASN628+CASN 650+GAL535), a black body locus and a 2700K MacAdam ellipse.
Figure 19:
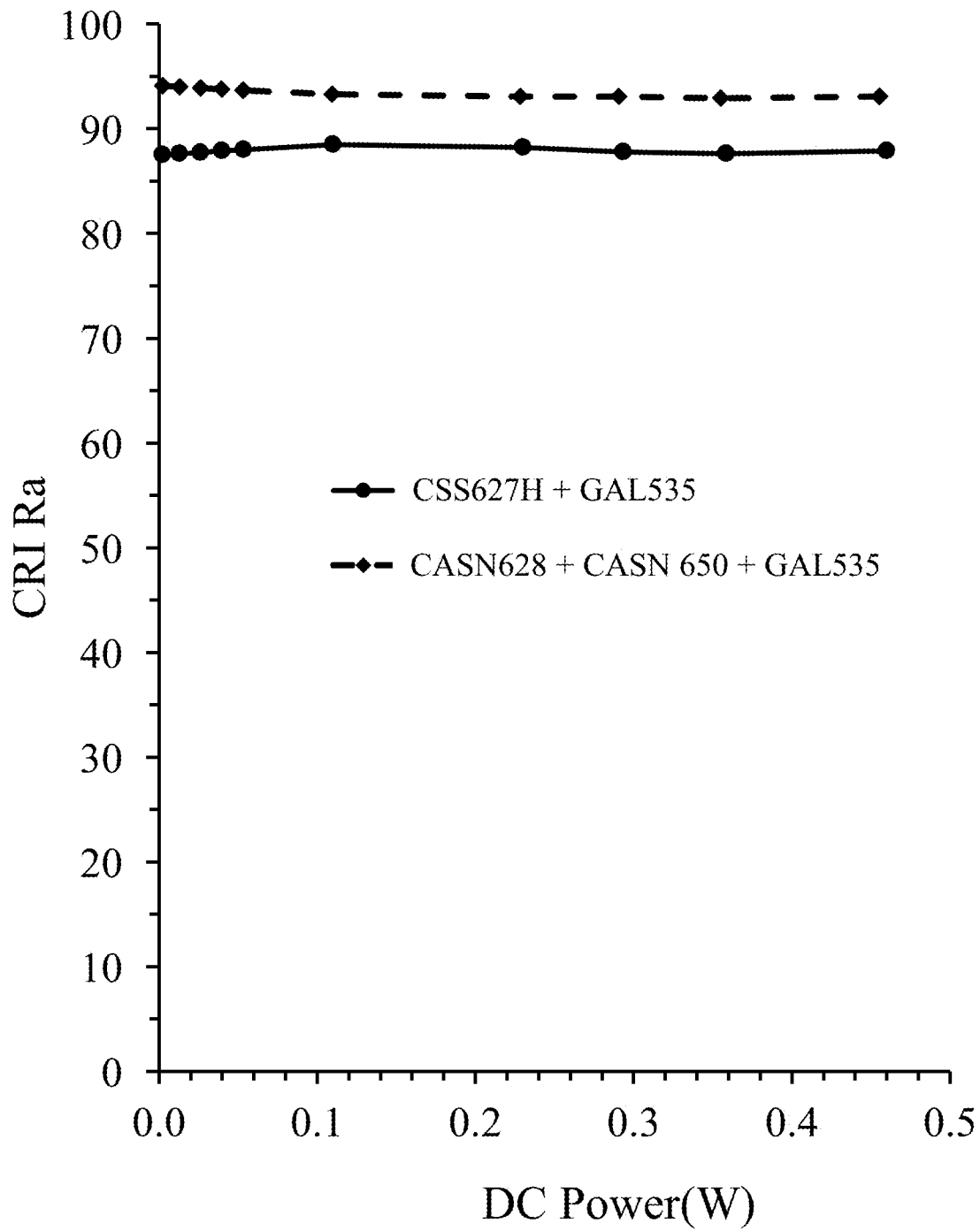
FIG. 19 shows measured general color rendering index (CRI Ra) versus DC Power (W) for (i) a white LED in accordance with the invention (CSS627H+GAL535), and (ii) a reference white LED (CASN628+CASN 650+GAL535)
Figure 20:
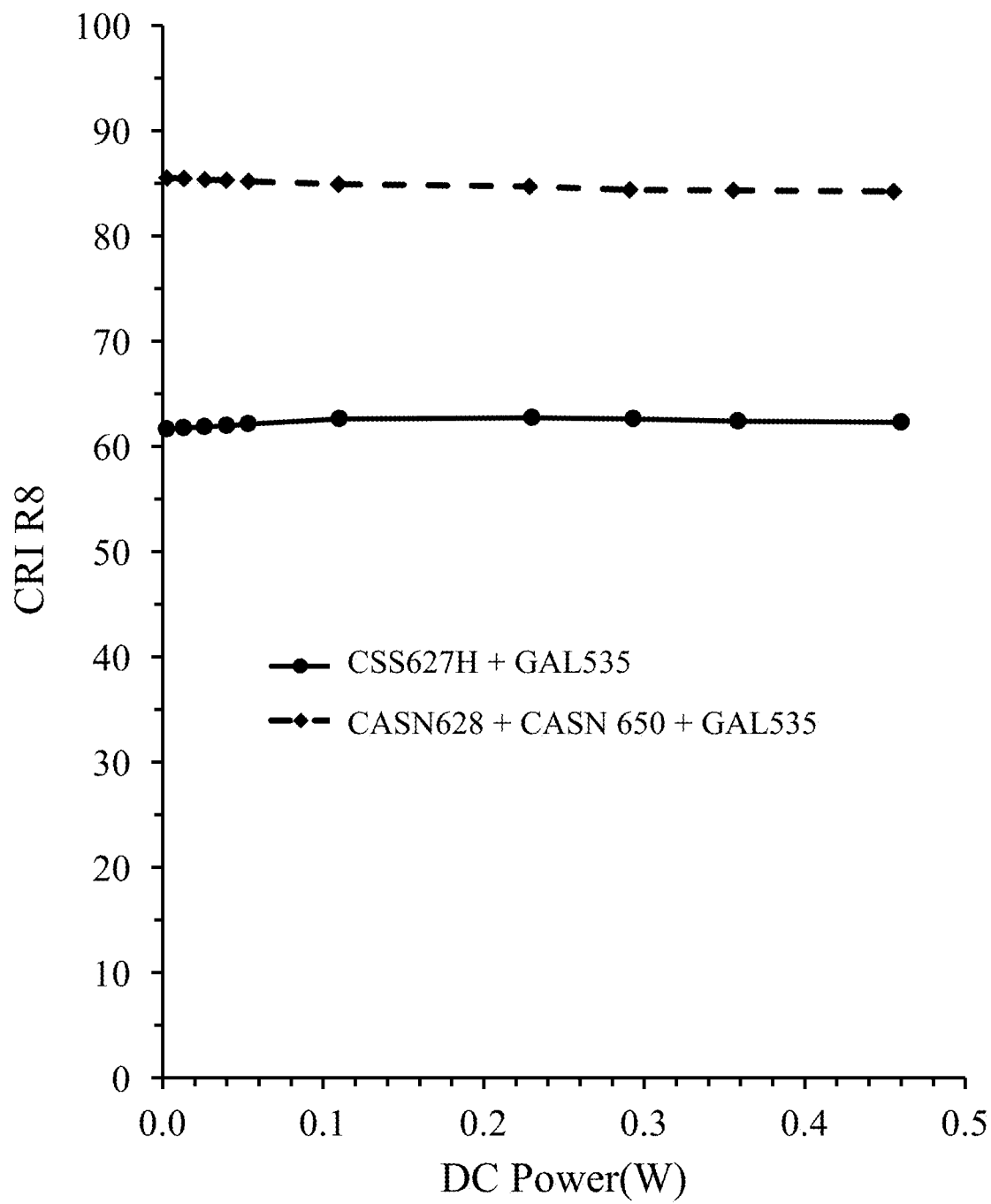
FIG. 20 shows measured color rendering index (CRI R8) versus DC Power (W) for (i) a white LED in accordance with the invention (CSS627H+GAL535), and (ii) a reference white LED (CASN628+CASN 650+GAL535)
Figure 21:
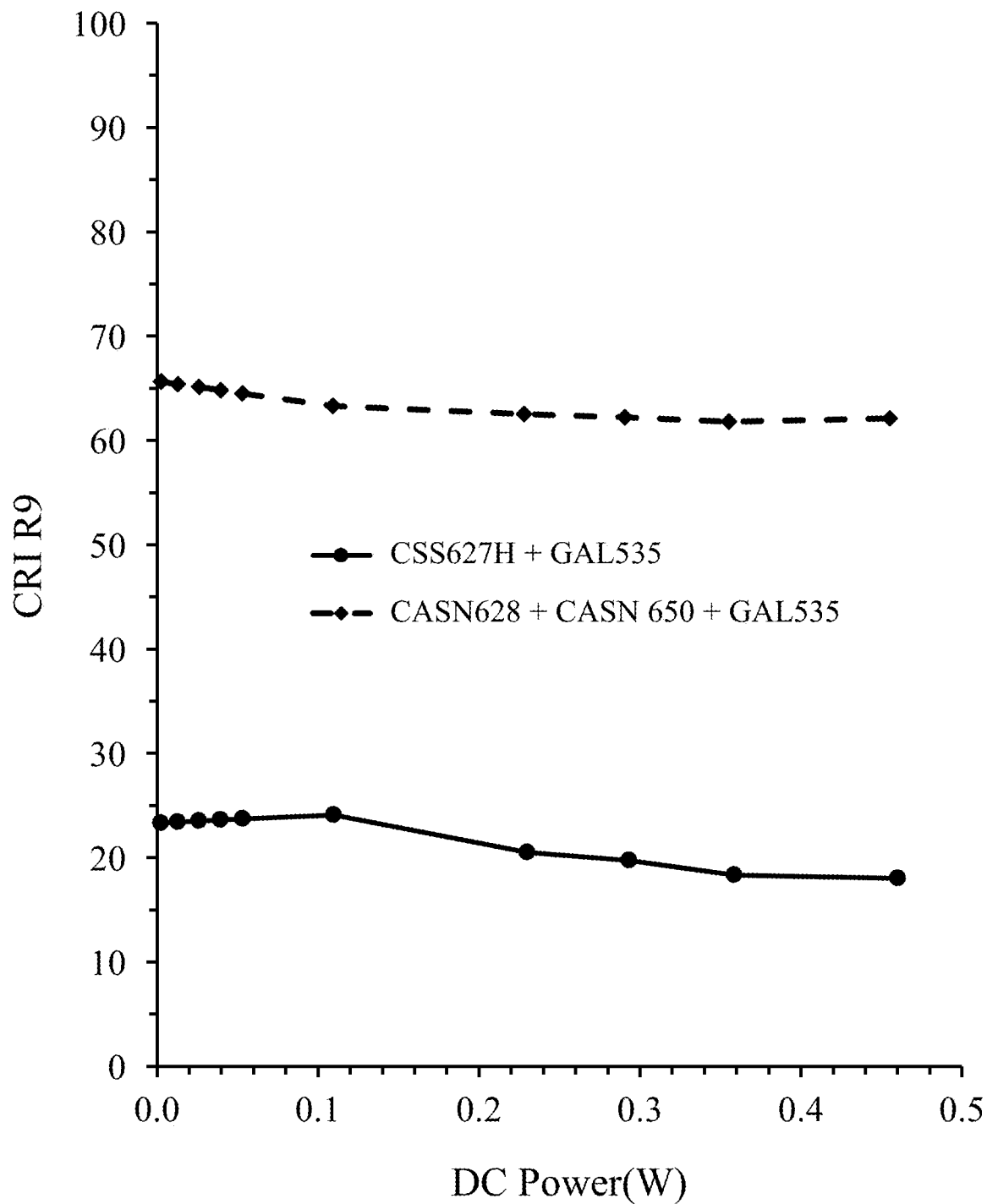
FIG. 21 shows measured general color rendering index (CRI R8) versus DC Power (W) for (i) a white LED in accordance with the invention (CSS627H+GAL535), and (ii) a reference white LED (CASN628+CASN 650+GAL535)
Figure 22:
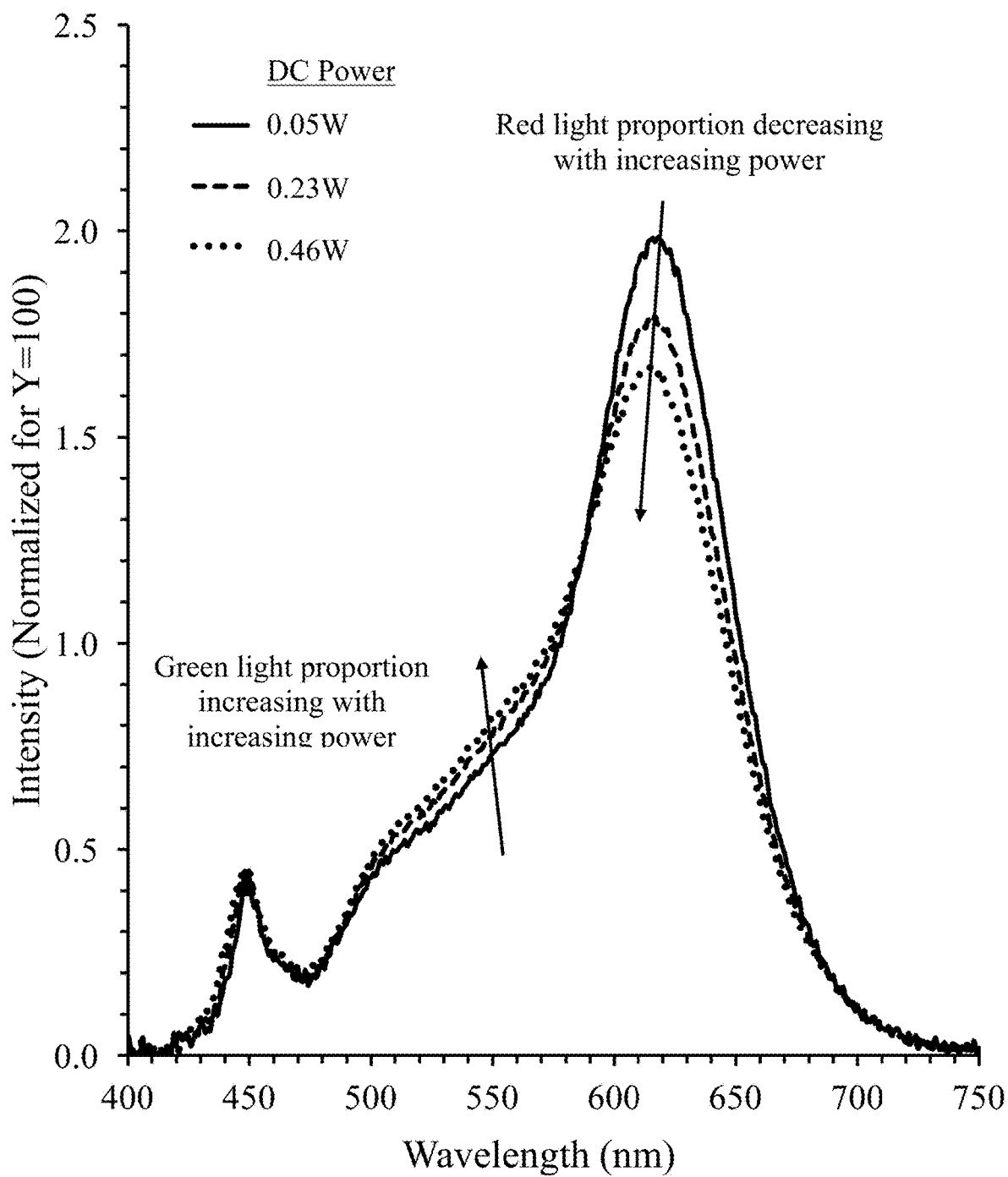
FIG. 22 shows measured emission spectra normalized intensity versus wavelength (nm) for a white LED in accordance with the invention (CSS627H+GAL535) for different DC power (W)
Figure 23:
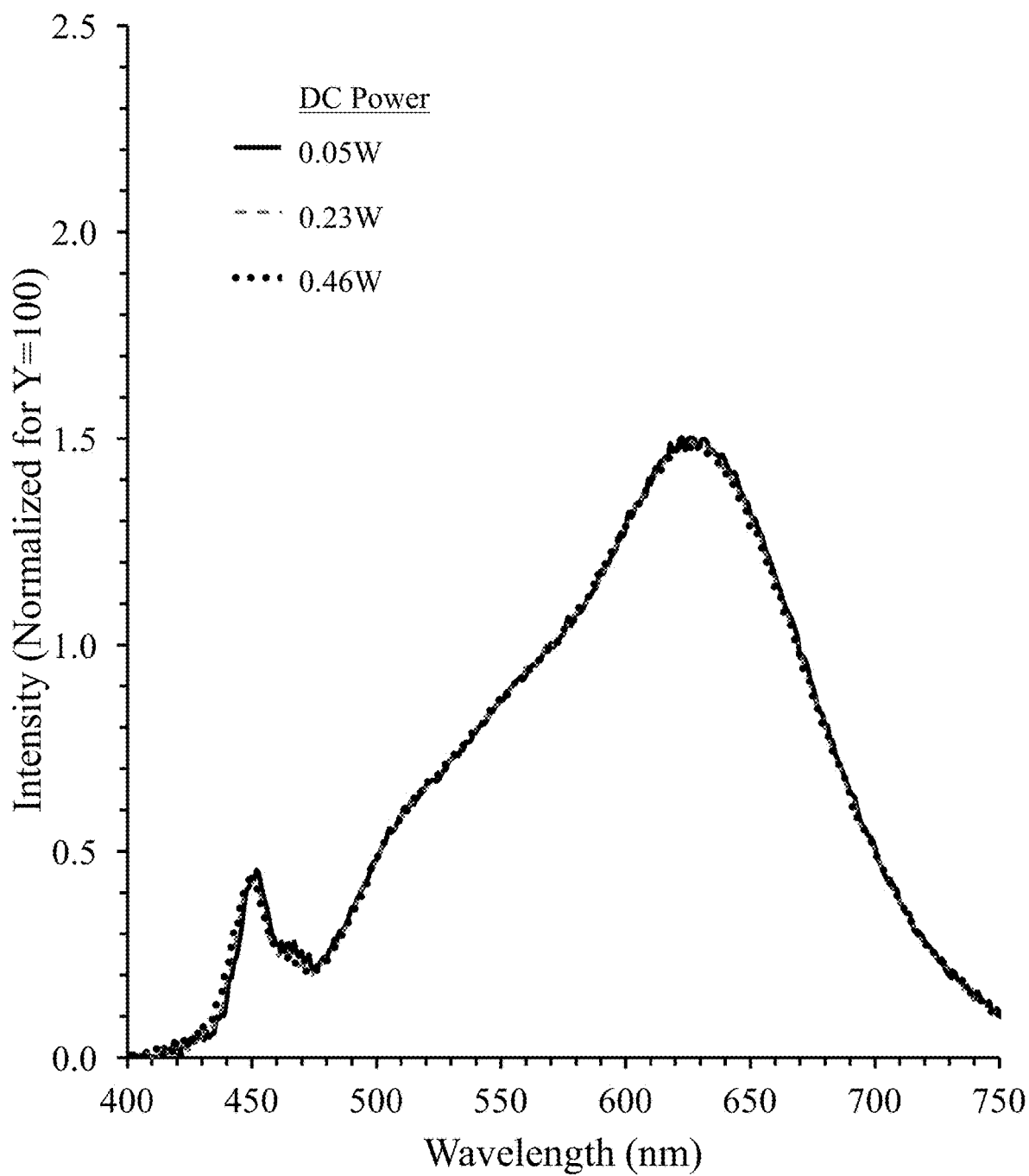
FIG. 23 shows measured emission spectra normalized intensity versus wavelength (nm) for a reference white LED (CASN628+CASN 650+GAL535) for different DC power (W).

FIGS. 17-22 show measured test data for a white LED in accordance with the invention comprising GAL535+ CSS627H as a function of DC power. More particularly, FIG. 17 shows measured CCT (K) versus DC Power (W) for a white LED in accordance with the invention; FIG. 18 shows measured chromaticity CIE y versus CIE x for a white LED in accordance with the invention, the black body locus and 2700K MacAdam ellipse; FIG. 19 shows measured Color Rendering Index CRI Ra versus DC Power (W) for a white LED in accordance with the invention; FIG. 20 shows measured Color Rendering Index CRI R8 versus DC Power (W) for a white LED in accordance with the invention; FIG. 21 shows measured Color Rendering Index CRI R9 versus DC Power (W) for a white LED in accordance with the invention; and FIG. 22 shows measured emission spectra normalized intensity versus wavelength (nm) for a white LED in accordance with the invention for different DC power (W). For comparison the figures also include measured test data for a reference white LED comprising a mixture of GAL535 (86.5 wt %), CASN628 (1.4 wt %) and CASN650 (12.1 wt %). FIG. 23 shows measured emission spectra normalized intensity versus wavelength (nm) the reference white LED for different DC power (W).

As can be seen from FIG. 17 and TABLE 8, the CCT of light generated by the white LED decreases from 2622K at full power (0.46 W) to 2187K at 7% of full power (0.003 W)—that is the white LED exhibits a warm dimming of about 440K. In comparison, the reference white LED exhibits a warm dimming of less than about 20K. FIGS. 19 to 21 and TABLE 8 indicate that CRI Ra and CRI R8 remain generally constant on dimming while CRI R9 decrease from about 24 to about 18 on dimming. A similar CRI characteristic is observed for the reference white LED.

Similar to LED-filament data described above (FIG. 16), the emission spectra of FIG. 22 indicate that a reduction in color temperature (CCT) on dimming results from the relative proportion of green light decreasing while the relative proportion of red light increases.

For comparison, FIG. 23 shows measured emission spectra normalized intensity versus wavelength (nm) the reference white LED for different DC power (W). These spectra indicate that there is no observable change in the relative proportion of red or green light with a change in DC power. It is believed that reason for this is that the red phosphor CASN650 exhibits a similar amount of "blue quenching" to that of the green phosphor GAL535 (FIG. 7)—i.e. their change of relative conversion efficiency with power are similar—resulting in a small overall color change.

As described above, the white LED test data were conducted using a pulsed current such that only the effects of "blue quenching" are being measured. As a result, the reason for the reduction in red light is due to "blue quenching". Thermal measurements of the white indicate that a further 300K of warm dimming may be possible for a temperature change of 25° C. to 100° C. For comparison, FIG. 23 shows measured emission spectra normalized intensity versus wavelength (nm) the reference white LED for different DC power (W) and indicates that there is no appreciable increase the proportion of green light on dimming.

To summarize, it is postulated that the invention is realized by the provision of a white light emitting device or LED-filament having a red-emitting phosphor and a yellow to green-emitting phosphor that are excitable by blue light (blue-light excitable) and in which "blue quenching" occurs in the red-emitting phosphor to a greater extent than the yellow to green-emitting phosphor. More particularly, the red phosphor exhibits a change in conversion efficiency with increasing power—more specifically, an increase in excitation (blue) photon density—that is substantially larger than the change in conversion efficiency of the yellow to green-emitting phosphor with increasing power. Such an arrangement has the effect that the relative proportion of green and red light in the emission spectrum will change with power and it is this change in the emission spectrum which results in a change in color temperature of emitted light in response to the change in power.

It will be appreciated that light emitting devices in accordance with the invention are not limited to the exemplary embodiments described and that variations can be made within the scope of the invention. For example whilst the invention has been described in relation to LED-based light emitting devices the invention also applies to devices based on other solid-state light emitters including solid-state lasers and laser diodes.

What is claimed is:

1. A white light emitting device comprising:
   a solid-state light emitter operable to generate excitation light upon application of electrical power thereto;
   a first phosphor associated with the solid-state light emitter to generate light with a peak emission wavelength in a range 500 nm to 575 nm; and
   a second phosphor associated with the solid-state light emitter to generate light with a peak emission wavelength in a range 600 nm to 650 nm,
   wherein a percentage decrease in conversion efficiency corresponding to an increase in excitation light photon density exhibited by the second phosphor is larger than a percentage decrease in conversion efficiency corresponding to the same increase in excitation light photon density exhibited by the first phosphor.

2. The white light emitting device of claim 1, wherein the percentage conversion efficiency of the second phosphor decreases by at least 8% in response to a 95% increase in excitation light photon density.

3. The white light emitting device of claim 1, wherein a percentage decrease in peak emission intensity corresponding to an increase in temperature exhibited by the second phosphor is larger than a percentage decrease in peak emission intensity corresponding to the same increase in temperature exhibited by the first phosphor.

4. The white light emitting device of claim 3, wherein the percentage decrease in peak emission intensity of the second phosphor decreases by at least 18% in response to an increase in temperature from 25° C. to 200° C.

5. The white light emitting device of claim 1, wherein the second phosphor comprises a Group IIA/IIB selenide sulfide-based phosphor material.

6. The white light emitting device of claim 5, wherein said Group IIA/IIB selenide sulfide-based phosphor material has a composition $MSe_{1-x}S_x:Eu_y$, wherein M is at least one of Mg, Ca, Sr, Ba and Zn, $0<x<1.0$ and $0.0005 \leq y<0.005$.

7. The white light emitting device of claim 6, wherein M is calcium.

8. The white light emitting device of claim 1, wherein in operation a decrease in electrical power to the solid-state light emitter of about 90% results in a decrease in CCT of emitted light of at least one of: of at least 400K, of at least 700K, and of at least 1500K.

9. The white light emitting device of claim 1, comprising a light transmissive substrate for at least mounting said solid-state light emitter thereon.

10. An LED-filament comprising:
    a solid-state light emitter operable to generate blue light with a dominant wavelength in a range 440 nm to 470 nm upon application of electrical power thereto;
    a light transmissive substrate for at least mounting said solid-state light emitter;
    a yellow to green-emitting phosphor associated with the solid-state light emitter to generate light with a peak emission wavelength in a range 500 nm to 575 nm; and
    a red-emitting phosphor associated with the solid-state light emitter to generate light with a peak emission wavelength in a range 600 nm to 650 nm,
    wherein a percentage decrease in conversion efficiency corresponding to an increase in blue light photon density exhibited by the red-emitting phosphor is larger than a percentage decrease in conversion efficiency corresponding to the same increase in excitation light photon density exhibited by the yellow to green-emitting phosphor.

11. The LED-filament of claim 10, wherein the percentage conversion efficiency of the red-emitting phosphor decreases by at least 8% in response to a 95% increase in blue light photon density.

12. The LED-filament of claim 10, wherein a percentage decrease in peak emission intensity corresponding to an increase in temperature exhibited by the red-emitting phosphor is larger than a percentage decrease in peak emission intensity corresponding to the same increase in temperature exhibited by the yellow to green-emitting phosphor.

13. The LED-filament of claim 12, wherein the percentage decrease in peak emission intensity of the red-emitting phosphor decreases by at least 18% in response to an increase in temperature from 25° C. to 200° C.

14. The LED-filament of claim 10, wherein the red-emitting phosphor comprises a Group IIA/IIB selenide sulfide-based phosphor material.

15. The LED-filament of claim 14, wherein said Group IIA/IIB selenide sulfide-based phosphor material has a composition $MSe_{1-x}S_x:Eu_y$, wherein M is at least one of Mg, Ca, Sr, Ba and Zn, $0<x<1.0$ and $0.0005 \leq y<0.005$.

16. The LED-filament of claim 15, wherein M is calcium.

17. The LED-filament of claim 10, wherein in operation a decrease in electrical power to the solid-state light emitter of about 90% results in a decrease in CCT of emitted light of at least one of: of at least 400K, of at least 700K, and of at least 1500K.

18. A white light emitting device or an LED-filament comprising:
    a solid-state light emitter to generate blue excitation light with a dominant wavelength in a range 440 nm to 470 nm;
    a yellow to green-emitting phosphor associated with the solid-state light emitter to generate light with a peak emission wavelength in a range 500 nm to 575 nm; and
    a red-emitting phosphor associated with the solid-state light emitter to generate light with a peak emission wavelength in a range 600 nm to 650 nm,
    wherein the red-emitting phosphor comprises a Group IIA/IIB selenide sulfide-based phosphor material, and
    wherein the white light emitting device is configured such that in operation a reduction in electrical power to the solid-state light emitter of about 90% results in a reduction in CCT of emitted light of at least 700K.

19. A method of dimming a white light emitting device or LED-filament comprising the steps of:
    providing a solid-state light emitter to generate excitation light with a dominant wavelength in a range 440 nm to 470 nm;
    supplying electrical power to the solid-state light emitter;
    providing a first phosphor associated with the solid-state light emitter to generate light with a peak emission wavelength in a range 500 nm to 575 nm;
    providing a second phosphor associated with the solid-state light emitter to generate light with a peak emission wavelength in a range 600 nm to 650 nm;
    wherein a percentage decrease in conversion efficiency corresponding to an increase in excitation light photon density exhibited by the second phosphor is larger than a percentage decrease in conversion efficiency corresponding to the same increase in excitation light photon density exhibited by the first phosphor; and
    decreasing the electrical power to the solid-state light emitter to decrease the excitation light photon density.

20. The method of claim 19, wherein decreasing the electrical power to the solid-state light emitter by about 90% results in decreasing the CCT of emitted light by at least one of: by at least 400K and by at least 700K.

* * * * *